(12) United States Patent
Goddard et al.

(10) Patent No.: US 10,403,821 B2
(45) Date of Patent: Sep. 3, 2019

(54) METHOD OF MAKING AN ELECTRODE

(71) Applicant: Cambridge Display Technology Limited, Godmanchester (GB)

(72) Inventors: Simon Goddard, Impington (GB); Nicholas Dartnell, Cambridgeshire (GB)

(73) Assignee: Cambridge Display Technology Limited, Godmanchester (GB)

( * ) Notice: Subject to any disclaimer, the term of this patent is extended or adjusted under 35 U.S.C. 154(b) by 33 days.

(21) Appl. No.: 15/313,298

(22) PCT Filed: May 21, 2015

(86) PCT No.: PCT/GB2015/051493
§ 371 (c)(1),
(2) Date: Nov. 22, 2016

(87) PCT Pub. No.: WO2015/177554
PCT Pub. Date: Nov. 26, 2015

(65) Prior Publication Data
US 2017/0194566 A1    Jul. 6, 2017

(30) Foreign Application Priority Data
May 22, 2014   (GB) .................................. 1409101.1

(51) Int. Cl.
*C08K 3/04*      (2006.01)
*C09D 11/52*    (2014.01)
(Continued)

(52) U.S. Cl.
CPC ........ *H01L 51/0022* (2013.01); *C09D 11/033* (2013.01); *C09D 11/037* (2013.01);
(Continued)

(58) Field of Classification Search
CPC .. C08K 2201/001; C08K 3/04; C09D 11/033; C09D 11/037; C09D 11/52;
(Continued)

(56) References Cited

U.S. PATENT DOCUMENTS

2003/0153141 A1* 8/2003 Carter ................. H01L 51/0022
                                                                        438/200
2004/0262582 A1   12/2004 Kirkor et al.
(Continued)

FOREIGN PATENT DOCUMENTS

| JP | 2004-227799 A | 8/2004 |
| JP | 2012-252856 A | 12/2012 |
| KR | 10-2014-0098922 A | 8/2014 |
| WO | WO 03/054981 A1 | 7/2003 |
| WO | WO 2014/112683 A1 | 7/2014 |

OTHER PUBLICATIONS

Lyous et. al., Solid-State Light-Emitting Devices Based on the Trischelated Ruthenium (II) Complex 1. Thin film Blends with Poly(ethylene oxide), J. Am. Chem; Soc., vol. 120, pp. 12100-12107, published Nov. 1998.*
(Continued)

*Primary Examiner* — Bilkis Jahan
*Assistant Examiner* — Victor V Barzykin
(74) *Attorney, Agent, or Firm* — Wolf, Greenfield & Sacks, P.C.

(57) ABSTRACT

A method of making an electrode for an organic electronic device comprises the steps of depositing an ink on a light emitting layer, and drying said ink to form said electrode. The ink comprises conductive metal or carbon particles, a binder and a hydrocarbon solvent selected from 1,1'-bicyclohexyl, cis-decalin trans-decaiin or n-undecane.

19 Claims, 4 Drawing Sheets

(51) Int. Cl.
*H01L 51/50* (2006.01)
*H01L 51/52* (2006.01)
*C09D 11/033* (2014.01)
*C09D 11/037* (2014.01)
*H01L 51/00* (2006.01)

(52) U.S. Cl.
CPC .......... *C09D 11/52* (2013.01); *H01L 51/5012* (2013.01); *H01L 51/5032* (2013.01); *H01L 51/5206* (2013.01); *H01L 51/5221* (2013.01); *C08K 3/04* (2013.01); *C08K 2201/001* (2013.01); *H01L 51/004* (2013.01); *H01L 51/0039* (2013.01); *H01L 51/0085* (2013.01); *H01L 2251/5369* (2013.01)

(58) Field of Classification Search
CPC ............... H01L 51/0022; H01L 51/004; H01L 51/5012; H01L 51/5032; H01L 51/5206; H01L 51/5221
See application file for complete search history.

(56) References Cited

U.S. PATENT DOCUMENTS

| 2010/0136341 | A1 | 6/2010 | Kirkor et al. |
| 2010/0143591 | A1* | 6/2010 | Wu ........................ C09D 11/36 427/256 |
| 2010/0151633 | A1 | 6/2010 | Wu et al. |
| 2016/0132141 | A1* | 5/2016 | Chung .................... G06F 3/041 216/18 |

OTHER PUBLICATIONS

Search Report dated Mar. 24, 2015 for Application No. GB 1409101.1.
International Search Report and Written Opinion dated Aug. 26, 2015 for Application No. PCT/GB2015/051493.
Kalmani et al., Development of conductive coated polyester film as RPC electrodes using screen printing. Nucl Instr Meth Phys Res A. Jan. 3, 2009;602(3):835-8.

* cited by examiner

METHOD OF MAKING AN ELECTRODE

RELATED APPLICATIONS

This application is a national stage filing under 35 U.S.C. § 371 of international PCT application, PCT/GB2015/051493, filed May 21, 2015, which claims priority to United Kingdom patent application, GB 1409101.1, filed May 22, 2014, each of which is incorporated herein by reference in its entirety.

FIELD OF THE INVENTION

The present invention relates to a method of making an electrode for an organic electronic device and to a method of making a layered structure comprising the electrode. The invention also relates to a method of making an organic electronic device (e.g. an OLED or LEC). In the methods of the invention, the electrode is preferably prepared by printing and especially by screen printing.

BACKGROUND

Organic electronic devices provide many potential advantages including inexpensive, low temperature, large scale fabrication on a variety of substrates including glass and plastic. Examples of such devices are organic light emitting devices (OLEDs) and light emitting electrochemical cells (LECs).

Organic light emitting diode (OLED) displays, for example, provide additional advantages as compared with other display technologies—in particular they are bright, colourful, fast-switching and provide a wide viewing angle. OLED devices (which here include organometallic devices and devices including one or more phosphors) may be fabricated using either polymers or small molecules in a range of colours and in multi-coloured displays depending upon the materials used. For general background information reference may be made, for example, to WO90/13148, WO95/06400, WO99/48160 and U.S. Pat. No. 4,539,570, as well as to "Organic Light Emitting Materials and Devices" edited by Zhigang Li and Hong Meng, CRC Press (2007), ISBN 10: 1-57444-574X, which describes a number of materials and devices, both small molecule and polymer.

In its most basic form an OLED comprises a light emitting layer which is positioned in between an anode and a cathode. In operation holes are injected through the anode into the light emitting layer and electrons are injected into the light emitting layer through the cathode. The holes and electrons combine in the light emitting layer to form an exciton which then undergoes radiative decay to provide light.

In its basic form a light emitting electrochemical cell (LEC) also comprises a light emitting layer which is positioned in between an anode and a cathode. In a LEC, however, the light emitting layer also comprises an electrolyte and a salt(s). Light is generated when holes and electrons, injected from the anode and cathode respectively, combine in the light emitting layer. For general background information on LECs, reference may be made to U.S. Pat. No. 5,682,043 and WO2011/032010.

Screen printing, gravure printing, flexographic printing, dispense printing, nozzle printing and ink-jet printing are cost-effective methods for depositing some, and more preferably, all of the layers of organic light emitting devices. Such techniques are attractive because they are relatively cheap, partly because they can be carried out in ambient conditions and provide high throughput, readily adaptable patterning and the ability to process flexible substrates.

To date, printing is more commonly used to deposit the light emitting layer of organic light emitting devices than the electrodes, and particularly the electrode that is present on top of the light emitting layer. Instead, techniques such as vacuum evaporation of low work function metals have been used for this top electrode, which can greatly increase the complexity and cost of fabricating the device.

The difficulty with printing an electrode on a light emitting layer is that it tends to cause damage to the light emitting layer which in turn decreases the electrical performance of the device in which the layers are present and increases the risk of shorting between the anode and cathode when deposited. The solvents used in inks for printing tend to dissolve components of the light emitting layer which increases the surface roughness of the light emitting layer, damages the light emitting layer/electrode interface and increases the inhomogeneity within the layer, e.g. by dissolving and removing components of the layer. The thermal treatment required to remove the solvent from a printed ink can also cause damage or worsen the damage caused by contact with the solvent.

These effects are exacerbated in light emitting layers comprising polar and non-polar polymers (e.g. PEO and light emitting polymer) as well as small molecule polar components. Such layers are particularly common in LECs. Light emitting layers comprising polar and non-polar polymers tend to have relatively rough surfaces due to the tendency of the polymers to phase separate. If an ink comprising a solvent is then applied to this surface it almost always dissolves the polar polymer and polar components to a greater extent than the less polar polymer and the inhomogeneity is worsened further. Leaching of the polar components also occurs. Using inks comprising non-polar solvents does not, however, solve this problem since these inks will simply dissolve or preferentially dissolve the less polar polymer.

Hence there remains a need for improved methods of making electrodes for organic electronic devices comprising a light emitting layer.

SUMMARY OF INVENTION

Viewed from a first aspect the present invention provides a method of making an electrode for an organic electronic device comprising:
(i) depositing an ink on a light emitting layer; and
(ii) drying said ink to form said electrode;
wherein said ink comprises conductive metal or carbon particles, a binder and a hydrocarbon solvent.

Viewed from a further aspect the present invention provides a method of making a layered structure for an organic electronic device comprising:
(i) depositing a light emitting layer on a surface;
(ii) drying said light emitting layer;
(iii) depositing an ink on said light emitting layer; and
(iv) drying said ink to form said electrode;
wherein said ink comprises conductive particles, a binder and a hydrocarbon solvent.

Viewed from a further aspect the present invention provides a method of making an organic electronic device comprising:
(i) providing an anode on a substrate;
(ii) depositing a light emitting layer on said anode;
(iii) drying said light emitting layer;
(iv) depositing an ink on said light emitting layer; and (v) drying said ink to form said electrode,
wherein said ink comprises conductive particles, a binder and a hydrocarbon solvent.

Preferably the device is an OLED or a LEC.

Viewed from a further aspect the present invention provides a device obtainable by a method as hereinbefore described.

Viewed from a further aspect the present invention provides a use of an ink to print an electrode on a light emitting layer of an organic electronic device, wherein said ink comprises conductive metal or carbon particles, a binder and a hydrocarbon solvent.

Viewed from a further aspect the present invention provides an ink for printing an electrode for an organic electronic device comprising: carbon particles, a binder and a hydrocarbon solvent.

Viewed from a further aspect the present invention provides a method as substantially hereinbefore described with reference to the examples.

Definitions

As used herein the term "electrode" refers to an anode or a cathode.

As used herein the term "ink" refers to a composition comprising conductive particles, a binder and a solvent.

As used herein the term "conductive particles" refers to particles which can conduct electricity.

As used herein the term "binder" is used to refer to a polymer which forms a continuous matrix in which the conductive particles can be dispersed.

As used herein the term "hydrocarbon solvent" refers to a solvent comprising or consisting of an aliphatic hydrocarbon comprising C and H atoms, but which does not comprise any O atoms. As used herein the term "aliphatic" refers to a non-aromatic hydrocarbon.

As used herein the term "screen printing" refers to a process wherein a squeegee or blade is used to apply force or pass ink through a mesh which has areas of the mesh blocked in a patternwise fashion so that the ink is transferred through the mesh to an underlying substrate forms a negative of the blocked pattern on the mesh.

As used herein the term "boiling point" refers to the temperature at which a substance boils at atmospheric pressure.

As used herein the term "dielectric constant" refers to a measure of the relative permittivity of a substance. It is an expression of the extent to which a substance concentrates electric flux and is a measure of the polarity of a substance.

As used herein the term "vapour pressure" refers to the pressure exerted by a vapour in thermodynamic equilibrium with its condensed phases (solid or liquid) at a given temperature in a closed system.

As used herein the term "saturated" refers to a hydrocarbon which does not comprise any unsaturation.

As used herein the term "polymer" refers to a compound comprising repeating units. Polymers usually have a polydispersity of greater than 1.

As used herein the term "light emitting polymer" refers to a polymer that emits light.

As used herein the term "charge transporting polymer" refers to a polymer that can transport holes or electrons.

As used herein the term "polar" refers to a separation of charge within the structure of a molecule. "Polar groups" are those groups wherein there is a covalent bond between two atoms wherein the electrons forming the bond are unequally distributed. The term encompasses electrical dipole moments where the distribution of charge in the bond is only slightly uneven creating a slightly positive end and a slightly negative end. The term also encompasses zwitterions and ionic groups where the charge separation is complete.

As used herein the term "salt" refers to an ionic substance comprising a cation and a counteranion.

As used herein the term "cross linkable group" refers to a group comprising an unsaturated bond or a precursor capable of in situ formation of an unsaturated bond that can undergo a bond-forming reaction.

As used herein the term "alkyl" refers to saturated, straight chained, branched or cyclic groups. Alkyl groups may be substituted or unsubstituted.

As used herein the term "haloalkyl" refers to saturated, straight chained, branched or cyclic groups in which one or more hydrogen atoms are replaced by a halo atom, e.g. F or Cl, especially F.

As used herein, the term "cycloalkyl" refers to a saturated or partially saturated mono- or bicyclic alkyl ring system containing 3 to 10 carbon atoms. Cycloalkyl groups may be substituted or unsubstituted.

As used herein, the terms "heterocycloalkyl" and "heterocyclic" refers to a cycloalkyl group in which one or more ring carbon atoms are replaced by at least one hetero atom such as —O—, —N— or —S—. Heterocycloalkyl groups may be substituted or unsubstituted.

As used herein the term "alkenyl" refers to straight chained, branched or cyclic group comprising a double bond. Alkenyl groups may be substituted or unsubstituted.

As used herein the term "alkynyl" refers to straight chained, branched or cyclic groups comprising a triple bond. Alkynyl groups may be substituted or unsubstituted.

Optional substituents that may be present on alkyl, cycloalkyl, heterocycloalkyl, alkenyl and alkynyl groups as well as the alkyl moiety of an arylalkyl group include $C_{1-16}$ alkyl or $C_{1-16}$ cycloalkyl wherein one or more non-adjacent C atoms may be replaced with O, S, N, C=O and —COO—, substituted or unsubstituted $C_{5-14}$ aryl, substituted or unsubstituted $C_{5-14}$ heteroaryl, $C_{1-16}$ alkoxy, $C_{1-16}$ alkylthio, halo, e.g. fluorine and chlorine, cyano and arylalkyl.

As used herein, the term "aryl" refers to a group comprising at least one aromatic ring. The term aryl encompasses heteroaryl as well as fused ring systems wherein one or more aromatic ring is fused to a cycloalkyl ring. Aryl groups may be substituted or unsubstituted.

As used herein, the term "heteroaryl" refers to a group comprising at least one aromatic ring in which one or more ring carbon atoms are replaced by at least one hetero atom such as —O—, —N— or —S—.

Optional substituents that may be present on aryl or heteroaryl groups as well as the aryl moiety of arylalkyl groups include halide, cyano, $C_{1-16}$ alkyl, $C_{1-16}$ fluoroalkyl, $C_{1-16}$ alkoxy, $C_{1-16}$ fluoroalkoxy, $C_{5-14}$ aryl and $C_{5-14}$ heteroaryl.

As used herein, the term "arylalkyl" refers to an alkyl group as hereinbefore defined that is substituted with an aryl group as hereinbefore defined.

As used herein, the term "heteroarylalkyl" refers to an alkyl group as hereinbefore defined that is substituted with a heteroaryl group as hereinbefore defined.

As used herein the term "halogen" encompasses atoms selected from the group consisting of F, Cl, Br and I.

As used herein the term "alkoxy" refers to O-alkyl groups, wherein alkyl is as defined above.

As used herein the term "aryloxy" refers to O-aryl groups, wherein aryl is as defined above.

As used herein the term "arylalkoxy" refers to O-arylalkyl groups, wherein arylalkyl is as defined above.

As used herein the term "alkylthio" refers to S-alkyl groups, wherein alkyl is as defined above.

As used herein the term "arylthio" refers to S-aryl groups, wherein aryl is as defined above.

As used herein the term "arylalkylthio" refers to S-arylalkyl groups, wherein arylalkyl are as defined above.

DESCRIPTION OF THE INVENTION

The method of the present invention is for preparing an electrode for an organic electronic device. The electrode is preferably used in an organic electronic device as a cathode or an anode and more preferably as a cathode.

In the method of the present invention the electrode is prepared by depositing an ink on a light emitting layer and drying the ink to form the electrode. Preferably the ink is deposited by printing such as screen printing, gravure printing, dispense printing, nozzle printing, flexographic printing and ink-jet printing. Screen printing is particularly preferred. Printing, and in particular screen printing, is a highly advantageous process as it enables large area patterning on flexible substrates at relatively low cost.

The inks conventionally used in printing of electrodes comprise conductive particles such as silver or carbon particles, a binder such as cellulose or acrylate polymers and a solvent. The purpose of the binder is to provide a continuous matrix for the conductive particles during printing so that when the printed ink is subsequently heated, the particles fuse to form a continuous conductive track. The purpose of the solvent is to dissolve the binder for printing. The dissolution of the binder ensures that a homogenous binder/conductive particle mixture is formed which in turn leads to a more even distribution of the conductive particles during and after printing. The solvents typically used in inks for printing of electrodes are polar solvents such as terpineol, carbitol acetate, gamma-butyrolactone, dibutyl carbitol, dibutyl phthalate, hexanol, 2,2,4-trimethylpentanediol-1,3-monoisobutyrate which dissolve binders.

In the method of the present invention, the ink comprises conductive particles, a binder and a hydrocarbon solvent. The hydrocarbon solvent is critical to the success of the method. Critically the hydrocarbon solvent dissolves the binder present in the ink, but does not dissolve the various different components, including the polar and less polar components, of the light emitting layer onto which the electrode is deposited. This means that the surface of the light emitting layer is not significantly modified, e.g. roughened or changed in thickness, during the step of depositing the electrode. This, in turn, means that the electrical performance, including the level of short circuits, of the devices into which the light emitting layer and electrode are incorporated is not negatively impacted.

In preferred methods and inks of the invention the hydrocarbon solvent is a $C_{8-18}$ hydrocarbon, more preferably a $C_{9-16}$ hydrocarbon, still more preferably a $C_{10-14}$ hydrocarbon and yet more preferably a $C_{10}$, $C_{11}$, or $C_{12}$ hydrocarbon.

Preferably the hydrocarbon solvent has a boiling point of 170 to 350° C., more preferably 180 to 250° C. and still more preferably 190 to 240. Preferably the hydrocarbon solvent has a vapour pressure of less than 200 Pa, more preferably less than 80 Pa and still more preferably less than 60 Pa, when measured at at 25° C. The boiling point of the hydrocarbon solvent should not be too low as it makes handling of the ink more difficult, e.g. evaporation of the solvent leads to increases in the viscosity of the ink. At the opposite end of the spectrum, however, hydrocarbon solvents having too high a boiling point, e.g. >350° C. are difficult to dry after deposition on the light emitting layer. Preferably the hydrocarbon solvent has a dielectric constant of 1 to 5, more preferably 1.2 to 4 and still more preferably 1.5 to 3. The dielectric constant of a solvent provides a rough measure of its polarity. Thus hydrocarbon solvents having the afore-mentioned dielectric constants are those having sufficient polarity to dissolve the binder present in the ink, but insufficient polarity to dissolve the components of the light emitting layer.

Preferably the hydrocarbon solvent does not comprise any nitrogen atoms. Preferably the hydrocarbon solvent does not comprise any S atoms. Still more preferably the hydrocarbon solvent consists essentially of, and yet more preferably consists of, C and H atoms. Preferably the hydrocarbon solvent is saturated.

Preferably the hydrocarbon solvent is an acyclic or cyclic hydrocarbon. In both cases, the hydrocarbon may be substituted or unsubstituted and/or branched or unbranched. More preferably the hydrocarbon solvent is selected from formula (I) or formula (II) or mixtures thereof:

(I)

wherein
each $R^1$ is independently selected from H and $C_{1-6}$ alkyl;
each $R^2$ is independently selected from H and $C_{1-6}$ alkyl; and
n is an integer between 4 and 16;

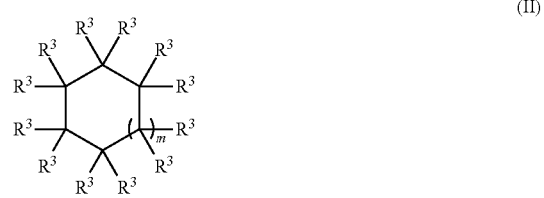

(II)

wherein
each $R^3$ is independently selected from H, $C_{1-6}$ alkyl and $C_{5-10}$ cycloalkyl, or
two $R^3$ groups on adjacent carbon atoms, together with the carbon atoms to which they are attached, form a ring or
two $R^3$ groups on the same carbon atom, together with the carbon atom to which they are attached, form a ring; and
m is 0 or an integer between 1 and 6.

In some preferred methods and inks of the invention, the hydrocarbon solvent is of formula (I). Preferably the hydrocarbon solvent consists of a single compound of formula (I).

Preferred hydrocarbon solvents of formula (I) are those wherein n is 4 to 14, still more preferably 4 to 12 and yet more preferably 4 to 10. In preferred hydrocarbon solvents of formula (I) the sum of n plus the number of carbon atoms in $R^1$ and $R^2$ is 10 to 18, more preferably 10 to 14 and still more preferably 10 to 12.

In some preferred hydrocarbon solvents of formula (I) n is 8 to 14 and each $R^1$ group and $R^2$ group is H. Representative examples of suitable hydrocarbon solvents include n-decane, n-undecane, n-dodecane, n-tridecane and n-tetradecane.

Representative examples of preferred hydrocarbon solvents of formula (I) include 2,2-dimethyl-4-ethylhexane, 3,3-diethylpentane, 2,2-dimethyl-4-ethylhexane, 2,2,4-trimethylheptane, 2,2,4,5-tetramethylhexane, 2,2,5-trimethylheptane, 2,2,6-trimethylheptane, 2,2,3,5-tetramethylhexane, 2,3,3,5-tetramethylhexane, 2,2,4,4-tetramethylhexane, 2,2,3,4-tetramethylhexane, 2,2-dimethyloctane, 3-ethyl-2,2,4-trimethylpentane, 2,3,5-trimethylheptane, 2,3,6-trimethylheptane, 2,4-dimethyloctane, 2,5-dimethyloctane, 2,3,5-trimethylheptane, 2,5-dimethyl-3-ethylhexane, 2,4,5-trimethylheptane, 2,4-dimethyl-3-isopropylpentane, 2,2,3-trimethylheptane, 2,4-dimethyl-2-ethylhexane, 2,2-dimethyl-3-ethylhexane, 2,2,3,4,4-pentamethylpentane, 5-ethyl-2-methylheptane, 2,7-dimethyloctane, 3,6-dimethyloctane, 4-isopropylheptane, 2,3,3-trimethylheptane, 4-ethyl-2-methylheptane, 2,6-dimethyloctane, 2,2,3,3-tetramethylhexane, 4,4-dimethyloctane, 2,3,4,5-tetramethylhexane, 5-ethyl-3-methylheptane, 3,3-dimethyloctane, 4,5-dimethyloctane, 3,4-diethylhexane, 4-propylheptane, 1,1,4-trimethylheptane 2,3,4,4-tetramethylhexane, 2,3,4-trimethylheptane, 3-isopropyl-2-methylhexane, 3-ethyl-3-methylheptane, 2,4-dimethyl-3-ethylhexane, 3,4,4-trimethylheptane, 3,4,5-trimethylheptane, 2,3-dimethyl-4-ethylhexane, 2,3-dimethyloctane, 2,3,3,4-tetramethylhexane, 3-3-dimethyl-4-ethylhexane, 5-methylnonane, 4-methylnonane, 3-ethyl-2-methylheptane, 3,4-dimethyloctane, 2,2,3,3,4-pentamethylpentane, 3,3-diethylhexane, 2-methylnonane, 3-ethyl-4-methylheptane, 4-ethyl-3-methylheptane, 4-ethyl-4-methylheptane, 3-methylnonane, 3-ethyloctane, 4-ethyloctane 3-ethyl-2,2,3-trimethylpentane, 2,3-dimethyl-3-ethylhexane, 3,4-dimethyl-3-ethyhexane, 3,3,4,4-tetramethylhexane, n-decane, 2,4,6,8-tetramethylnonane, n-undecane, 3-methylundecane, n-dodecane, n-tridecane and n-tetradecane.

In further preferred hydrocarbon solvents of formula (Ii) the hydrocarbon solvent is selected from formula (Ii):

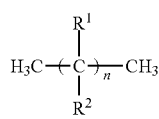

(Ii)

wherein
each $R^1$ is independently selected from H and $C_{1-6}$ alkyl;
each $R^2$ is independently selected from H and $C_{1-6}$ alkyl;
with the proviso that at least one $R^1$ or $R^2$ group is $C_{1-6}$ alkyl; and
n is an integer between 4 and 7.

In particularly preferred hydrocarbon solvents n is 4 to 6 and the $R^1$ and $R^2$ groups present provide at least 2 carbon atoms and more preferably 2 to 4 carbon atoms.

Preferably the $R^1$ and $R^2$ groups present are $C_{1-3}$ alkyl, e.g. methyl, ethyl, n-propyl or isopropyl. In particularly preferred solvents of formula (Ii) n is 4 to 6, and more preferably 4 or 5, and at least one $R^1$ group or $R^2$ group is $C_{1-6}$ alkyl, e.g. methyl, ethyl, n-propyl or isopropyl.

Representative examples of suitable hydrocarbon solvents of formula (Ii) include 2,2-dimethyl-4-ethylhexane, 3,3-diethylpentane, 2,2-dimethyl-4-ethylhexane, 2,2,4-trimethylheptane, 2,2,4,5-tetramethylhexane, 2,2,5-trimethylheptane, 2,2,6-trimethylheptane, 2,2,3,5-trimethylhexane, 2,3,3,5-tetramethylhexane, 2,2,4,4-tetramethylhexane, 2,2,3,4-tetramethylhexane, 2,2-dimethyloctane, 3-ethyl-2,2,4-trimethylpentane, 2,3,5-trimethylheptane, 2,3,6-trimethylheptane, 2,4-dimethyloctane, 2,5-dimethyloctane, 2,3,5-trimethylheptane, 2,5-dimethyl-3-ethylhexane, 2,4,5-trimethylheptane, 2,4-dimethyl-3-isopropylpentane, 2,2,3-trimethylheptane, 2,4-dimethyl-2-ethylhexane, 2,2-dimethyl-3-ethylhexane, 2,2,3,4,4-pentamethylpentane, 5-ethyl-2-methylheptane, 2,7-dimethyloctane, 3,6-dimethyloctane, 4-isopropylheptane, 2,3,3-trimethylheptane, 4-ethyl-2-methylheptane, 2,6-dimethyloctane, 2,2,3,3-tetramethylhexane, 4,4-dimethyloctane, 2,3,4,5-tetramethylhexane, 5-ethyl-3-methylheptane, 3,3-dimethyloctane, 4,5-dimethyloctane, 3,4-diethylhexane, 4-propylheptane, 1,1,4-trimethylheptane 2,3,4,4-tetramethylhexane, 2,3,4-trimethylheptane, 3-isopropyl-2-methylhexane, 3-ethyl-3-methylheptane, 2,4-dimethyl-3-ethylhexane, 3,4,4-trimethylheptane, 3,4,5-trimethylheptane, 2,3-dimethyl-4-ethylhexane, 2,3-dimethyloctane, 2,3,3,4-tetramethylhexane, 3-3-dimethyl-4-ethylhexane, 5-methylnonane, 4-methylnonane, 3-ethyl-2-methylheptane, 3,4-dimethyloctane, 2,2,3,3,4-pentamethylpentane, 3,3-diethylhexane, 2-methylnonane, 3-ethyl-4-methylheptane, 4-ethyl-3-methylheptane, 4-ethyl-4-methylheptane, 3-methylnonane, 3-ethyloctane, 4-ethyloctane 3-ethyl-2,2,3-trimethylpentane, 2,3-dimethyl-3-ethylhexane, 3,4-dimethyl-3-ethyhexane, 3,3,4,4-tetramethylhexane, 2,4,6,8-tetramethylnonane and 3-methylundecane.

In some preferred methods and inks of the invention, the hydrocarbon solvent is of formula (II). Preferably the hydrocarbon solvent consists of a single compound of formula (II).

Preferred hydrocarbon solvents of formula (II) are those wherein m is 1, 2, 3, 4 or 5, still more preferably 1, 2 or 3 and yet more preferably 1. In preferred hydrocarbon solvents of formula (II) the sum of 5 plus m plus the number of carbon atoms in $R^3$ is 10 to 18, more preferably 10 to 14 and still more preferably 10 to 12

In some preferred hydrocarbon solvents of formula (II) m is 4, 5 or 6 and each $R^3$ group is H. Representative examples of suitable hydrocarbon solvents include cydononane and cydodecane.

In further preferred hydrocarbon solvents of formula (II), m is 0, 1, 2 or 3, more preferably 0 or 1 and still more preferably 1. In such hydrocarbon solvents the $R^3$ groups preferably provide at least 1 carbon atom, more preferably 1 to 6 carbons and still more preferably 3 or 6 carbon atoms. Preferably the $R^3$ groups present are $C_{1-3}$ alkyl (e.g. methyl, ethyl or isopropyl) or $C_{5-6}$ cycloalkyl.

In particularly preferred solvents of formula (II), m is 0 and the $R^3$ groups provide 4, 5 or 6 carbon atoms. In other particularly preferred solvents of formula (II), m is 1 and the $R^3$ groups provide 3, 4, 5 or 6, especially 4 or 6, carbon atoms. In both cases the $R^3$ groups are preferably selected from methyl, ethyl, n-propyl, i-propyl, n-butyl, t-butyl and cyclohexyl. Especially preferably $R^3$ is methyl, ethyl or cyclohexyl.

In further preferred hydrocarbon solvents of formula (II), two $R^3$ groups on adjacent carbon atoms, together with the carbon atoms to which they are attached form a ring or two $R^3$ groups on the same carbon atom, together with the carbon atom to which they are attached form a ring. Preferably the ring formed comprises 5, 6 or 7 carbon atoms and more preferably 6 carbon atoms. Preferably the ring formed is cyclohexyl.

Representative examples of suitable solvents of formula (II) that are suitable for use in the method of the invention include all-cis-1,2,3-trimethylcyclohexane, all-cis-1,2,4-trimethylcyclohexane, 1,2-trans-1,4-trans-1,2,4-trimethylcyclohexane, trans-1-ethyl-4-methylcyclohexane, cyclooctane, trans-1-ethyl-2-methylcyclohexane, nonane, 1,2-cis-1,3-trans-1,2,3-trimethylcyclohexane, 1,2-trans-1,3-cis-1,2,3-trimethylcyclohexane, 7,7-dimethylbicyclo[2.2.1]heptane, trans-1-ethyl-4-methylcyclohexane, cis-1,1,3,5-tetramethylcyclohexane, cis-1-ethyl-4-methylcyclohexane, 1,3,3-trimethylbicyclo[2.2.1]heptane, 2,5,5-trimethylheptane, 2,4,4-trimethylheptane, Isopropylcyclohexane, 1,1,3,3-tetramethylcyclohexane, cis-1-ethyl-3-methylcyclohexane, trans-1,1,3,5-tetramethylcyclohexane, n-butylcyclopentane, n-propylcyclohexane, 1,2-trans-1,3-cis-1,5-cis-1,2,3,5-tetramethylcydohexane, 1,1,3,4-tetramethylcyclohexane, 1,2-trans-1,4-trans-1,5-cis-1,2,4,5-tetramethylcyclohexane, 1,2-trans-1,3-cis-1,5-trans-1,2,3,5-tetramethylcyclohexane, 1,2-cis-1,3-trans-1,5-cis-1,2,3,5-tetramethylcydohexane, 1,2-trans-1,4-cis-1,5-trans-1,2,4,5-tetramethylcyclohexane, 2,2,7-trimethylbibyclo[2.2.1]heptane, 1-methyl-3-propylcyclohexane, 1,2-cis-1,3-trans-1,5-trans-1,2,3,5-tetramethylcyclohexane, 1,2-cis-1,4-cis-1,5-trans-1,2,4,5-tetramethylcydohexane, all-cis-1,2,3,5-tetramethylcyclohexane, trans-1-isopropyl-3-methylcyclohexane, 1,2-trans-1,3-cis-1,4-trans-1,2,3,4-tetramethylcyclohexane, cis-1-isopropyl-3-methylcyclohexane, tert-butylcyclohexane, cis-1-isopropyl-4-methylcyclohexane, trans-1-isopropyl-4-methylcyclohexane, 1,2-cis-1,3-cis-1,5-trans-1,2,3,5-tetramethylcyclohexane, 1,2-cis-1,4-trans-1,5-trans-1,2,4,5-tetramethylcyclohexane, 1,2-cis-1,3-trans-1,4-cis-1,2,3,4-tetramethylcyclohexane, 1,2-trans-1,3-trans-1,4-cis-1,2,3,4-tetramethylcyclohexane, cydononane, 1-isopropyl-2-methylcyclcohexane, 1,2-cis-1,3-cis-1,4-trans-1,2,3,4-tetramethylcyclohexane, 1,2-cis-1,3-trans-1,4-trans-1,2,3,4-tetramethylcyclohexane, 1-methyl-1-propylcyclohexane, 1-methyl-4-propylcyclohexane, all-cis-1,2,4,5-tetramethylcyclohexane, 1-methyl-2-propylcyclohexane, all-cis-1,2,3,4-tetramethylcyclohexane, n-pentylcyclopentane, n-butylcyclohexane, 1,1-bicyclopentyl, 1,1'-bicyclohexyl, trans-decalin, isoamylcyclohexane, cis-decalin, cyclodecane.

Representative examples of suitable solvents of formula (I) and (II) are as follows as well as mixtures thereof: 2,2-dimethyl-4-ethylhexane, 3,3-diethylpentane, 2,2-dimethyl-4-ethylhexane, 2,2,4-trimethylheptane, 2,2,4,5-tetramethylhexane, 2,2,5-trimethylheptane, 2,2,6-trimethylheptane, 2,2,3,5-tetramethylhexane, 2,3,3,5-tetramethylhexane, 2,2,4,4-tetramethylhexane, 2,2,3,4-tetramethylhexane, 2,2-dimethyloctane, 3-ethyl-2,2,4-trimethylpentane, 2,3,5-trimethylheptane, 2,3,6-trimethylheptane, 2,4-dimethyloctane, 2,5-dimethyloctane, 2,3,5-trimethylheptane, 2,5-dimethyl-3-ethylhexane, 2,4,5-trimethylheptane, 2,4-dimethyl-3-isopropylpentane, 2,2,3-trimethylheptane, 2,4-dimethyl-2-ethylhexane, 2,2-dimethyl-3-ethylhexane, 2,2,3,4,4-pentamethylpentane, 5-ethyl-2-methylheptane, 2,7-dimethyloctane, 3,6-dimethyloctane, 4-isopropylheptane, 2,3,3-trimethylheptane, 4-ethyl-2-methylheptane, 2,6-dimethyloctane, 2,2,3,3-tetramethylhexane, 4,4-dimethyloctane, 2,3,4,5-tetramethylhexane, 5-ethyl-3-methylheptane, 3,3-dimethyloctane, 4,5-dimethyloctane, 3,4-diethylhexane, 4-propylheptane, 1,1,4-trimethylheptane 2,3,4,4-tetramethylhexane, 2,3,4-trimethylheptane, 3-isopropyl-2-methylhexane, 3-ethyl-3-methylheptane, 2,4-dimethyl-3-ethylhexane, 3,4,4-trimethylheptane, 3,4,5-trimethylheptane, 2,3-dimethyl-4-ethylhexane, 2,3-dimethyloctane, 2,3,3,4-tetramethylhexane, 3-3-dimethyl-4-ethylhexane, 5-methylnonane, 4-methylnonane, 3-ethyl-2-methylheptane, 3,4-dimethyloctane, 2,2,3,3,4-pentamethylpentane, 3,3-diethylhexane, 2-methylnonane, 3-ethyl-4-methylheptane, 4-ethyl-4-methylheptane, 3-methylnonane, 3-ethyloctane, 4-ethyloctane 3-ethyl-2,2,3-trimethylpentane, 2,3-dimethyl-3-ethylhexane, 3,4-dimethyl-3-ethyhexane, 3,3,4,4-tetramethylhexane, n-decane, 2,4,6,8-tetramethylnonane, n-undecane, 3-methylundecane, n-dodecane, n-tridecane, n-tetradecane, all-cis-1,2,3-trimethylcyclohexane, all-cis-1,2,4-trimethylcyclohexane, 1,2-trans-1,4-trans-1,2,4-methylcyclohexane, trans-1-ethyl-4-methylcyclohexane, cyclooctane, trans-1-ethyl-2-methylcyclohexane, nonane, 1,2-cis-1,3-trans-1,2,3-trimethylcyclohexane, 1,2-trans-1,3-cis-1,2,3-trimethylcyclohexane, 7,7-dimethylbicyclo[2.2.1]heptane, trans-1-ethyl-4-methylcyclohexane, cis-1,1,3,5-tetramethylcyclohexane, cis-1-ethyl-4-methylcyclohexane, 1,3,3-trimethylbicyclo[2.2.1]heptane, 2,5,5-trimethylheptane, 2,4,4-trimethylheptane, Isopropylcyclohexane, 1,1,3,3-tetramethylcyclohexane, cis-1-ethyl-3-methylcyclohexane, trans-1,1,3,5-tetramethylcyclohexane, n-butylcyclopentane, n-propylcyclohexane, 1,2-trans-1,3-cis-1,5-cis-1,2,3,5-tetramethylcyclohexane, 1,1,3,4-tetramethylcyclohexane, 1,2-trans-1,4-trans-1,5-cis-1,2,4,5-tetramethylcyclohexane, 1,2-trans-1,3-cis-1,5-trans-1,2,3,5-tetramethylcyclohexane, 1,2-cis-1,3-trans-1,5-cis-1,2,3,5-tetramethylcydohexane, 1,2-trans-1,4-cis-1,5-trans-1,2,4,5-tetramethylcyclohexane, 2,2,7-trimethylbibyclo[2.2.1]heptane, 1-methyl-3-propylcyclohexane, 1,2-cis-1,3-trans-1,5-trans-1,2,3,5-tetramethylcyclohexane, 1,2-cis-1,4-cis-1,5-trans-1,2,4,5-tetramethylcyclohexane, all-cis-1,2,3,5-tetramethylcyclohexane, trans-1-isopropyl-3-methylcyclohexane, 1,2-trans-1,3-cis-1,4-trans-1,2,3,4-tetramethylcyclohexane, cis-1-isopropyl-3-methylcyclohexane, tert-butylcyclohexane, cis-1-isopropyl-4-methylcyclohexane, trans-1-isopropyl-4-methylcyclohexane, 1,2-cis-1,3-cis-1,5-trans-1,2,3,5-tetramethylcyclohexane, 1,2-cis-1,4-trans-1,5-trans-1,2,4,5-tetramethylcyclohexane, 1,2-cis-1,3-trans-1,4-cis-1,2,3,4-tetramethylcyclohexane, 1,2-trans-1,3-trans-1,4-cis-1,2,3,4-tetramethylcyclohexane, cyclononane, 1-isopropyl-2-methylcyclohexane, 1,2-cis-1,3-cis-1,4-trans-1,2,3,4-tetramethylcyclohexane, 1,2-cis-1,3-trans-1,4-trans-1,2,3,4-tetramethylcyclohexane, 1-methyl-1-propylcyclohexane, 1-methyl-4-propylcyclohexane, all-cis-1,2,4,5-tetramethylcyclohexane, 1-methyl-2-propylcyclohexane, all-cis-1,2,3,4-tetramethylcyclohexane, n-pentylcyclopentane, n-butylcyclohexane, 1,1-bicyclopentyl, 1,1'-bicyclohexyl, trans-decalin, isoamylcyclohexane, cis-decalin, cyclodecane.

More preferably, the hydrocarbon solvent is selected from the following, as well as mixtures thereof.

3-3-dimethyl-4-ethylhexane, 5-methylnonane, 4-methylnonane, 3-ethyl-2-methylheptane, 3,4-dimethyloctane, 2,2,3,3,4-pentamethylpentane, 3,3-diethylhexane, 2-methylnonane, 3-ethyl-4-methylheptane, 4-ethyl-3-methylheptane, 4-ethyl-4-methylheptane, 3-methylnonane, 3-ethyloctane, 4-ethyloctane 3-ethyl-2,2,3-trimethylpentane, 2,3-dimethyl-3-ethylhexane, 3,4-dimethyl-3-ethyhexane, 3,3,4,4-tetramethylhexane, n-decane, 2,4,6,8-tetramethylnonane, n-undecane, 3-methylundecane, n-dodecane, n-tridecane, n-tetradecane, 1,2-cis-1,3-trans-1,5-trans-1,2,3,5-tetramethylcydohexane, 1,2-cis-1,4-cis-1,5-trans-1,2,4,5-tetramethylcyclohexane, all-cis-1,2,3,5-tetramethylcyclohexane, trans-1-isopropyl-3-methylcyclohexane, 1,2-trans-1,3-cis-1,4-trans-1,2,3,4-tetramethylcyclohexane, cis-1-isopropyl-3-methylcyclohexane, tert-butylcyclohexane, cis-1-isopropyl-4-methylcyclohexane, trans-1-isopropyl-4-methylcyclohexane, 1,2-cis-1,3-cis-1,5-trans-1,2,3,5-tetramethylcyclohexane, 1,2-cis-1,4-trans-1,5-trans-1,2,4,5-tetramethylcyclohexane, 1,2-cis-1,3-trans-1,4-cis-1,2,3,4-tetramethylcyclohexane, 1,2-trans-1,3-trans-1,4-cis-1, 2,3,4-tetramethylcyclohexane, cyclononane, 1-isopropyl-2-methylcyclohexane, 1,2-cis-1,3-cis-1,4-trans-1,2,3,4-tetramethylcyclohexane, 1,2-cis-1,3-trans-1,4-trans-1,2,3,4-tetramethylcyclohexane, 1-methyl-1-propylcyclohexane, 1-methyl-4-propylcyclohexane, all-cis-1,2,4,5-tetramethylcyclohexane, 1-methyl-2-propylcyclohexane, all-cis-1,2,3,4-tetramethylcyclohexane, n-pentylcyclopentane, n-butylcyclohexane, 1,1-bicyclopentyl, 1,1'-bicyclohexyl, trans-decalin, isoamylcyclohexane, cis-decalin and cyclodecane.

Yet more preferably the hydrocarbon solvent is selected from the following, as well as mixtures, thereof:
1,1'-bicyclohexyl, cis-decalin, trans-decalin, n-decane, n-undecane or n-dodecane.

Even more preferably the hydrocarbon solvent is selected from the following, as well as mixtures thereof:
1,1'-bicyclohexyl, cis-decalin, trans-decalin or n-undecane.

Suitable solvents for use in the methods and inks of the invention are commercially available from, for example, Sigma Aldrich.

In the method of the present invention the conductive particles preferably comprise a metal and/or carbon. In some methods and inks the conductive particles preferably comprise carbon, e.g. graphite. In other methods the conductive particles preferably comprise metal. The particles may, for example, comprise a single metal or may comprise a mixture of metals, e.g. comprise an alloy. Preferably the metal is selected from W, Mo, Mn, Au, Ag, Al Pd and Cu. More preferably the metal is Ag. Suitable particles for use in the methods and inks of the present invention are commercially available from, for example, Sigma Aldrich.

In the method and inks of the present invention the binder is preferably a polymer. The polymer may be a thermoplastic polymer or a thermosetting polymer. Optionally the binder is cross linked. Preferably the binder comprises an alkyl cellulose, a poly(meth)acrylic, a poly(meth)acrylate, a styrene, an acrylamide, a vinyl ether, a polyvinyl alcohol or mixtures thereof. Still more preferably the binder comprises an alkyl cellulose, a poly(meth)acrylic, a poly(meth)acrylate or mixtures thereof. Suitable binders for use in the methods and inks of the present invention are commercially available from, for example, Sigma Aldrich.

Preferred inks of the present invention preferably comprise 10 to 95% wt conductive particles. When the conductive particles are metal, preferred inks comprise 60 to 90 wt % and still more preferably 65 to 85 wt % of conductive particles. When the conductive particles are carbon, preferred inks comprise 10 to 40% wt and still more preferably 25 to 35 wt % of carbon particles.

Preferred inks of the present invention preferably comprise 10 to 90% wt of hydrocarbon solvent. When the conductive particles are metal, preferred inks comprise 12.5 to 30 wt % and still more preferably 15 to 20 wt % of hydrocarbon solvent. When the conductive particles are carbon, preferred inks comprise 60 to 90 wt % and more preferably 65 to 85 wt % of hydrocarbon solvent.

Preferred inks of the present invention preferably comprise 1 to 20% wt, more preferably 5 to 17.5 wt % and still more preferably 10 to 15 wt % binder.

The inks of the present invention may be prepared by conventional techniques. Thus the components of the ink, i.e. conductive particles, binder and hydrocarbon solvent, are preferably mixed together in appropriate amounts.

Printing, e.g. screen printing, is carried out by conventional techniques in the art. Preferably the ink is applied to an optionally patterned mesh placed on the surface of a light emitting layer and a squeegee or blade is applied to force the ink through the mesh.

In the method of the present invention, the ink is dried following deposition on the light emitting layer to form an electrode. Drying is preferably carried out by heating with a box oven, an IR oven or a hot plate. During the drying process, the solvent is evaporated and a matrix comprising the conductive particles is formed. The heating also causes the conductive particles present in the ink to coalesce to form a conductive track. The skilled man is readily able to determine suitable drying conditions.

In the method of the present invention, the light emitting layer comprises a light emitting polymer. Preferably the light emitting polymer comprises at least two different monomers and more preferably at least three different monomers. Still more preferably the light emitting polymer layer comprises three, four or five different monomers. Optionally the light emitting layer further comprises a charge transporting polymer.

In the method of the present invention, the light emitting layer preferably comprises poly(ethylene oxide) (PEO). Still more preferably the light emitting layer comprises a light emitting polymer and poly(ethylene oxide).

The PEO present in the light emitting layer preferably has a volume average molecular weight of 10,000 to 8,000,000. The PEO may be linear, branched or cyclic, but is preferably linear. Preferably the PEO is —OH terminated. Optionally the PEO is substituted.

Preferably the light emitting polymer comprises a polar group. More preferably the light emitting polymer present in the light emitting layer comprises a repeat unit of formula (Xa) or (Xb):

wherein Ar is a $C_{5-20}$ substituted or unsubstituted aryl or heteroaryl group;
L is a bond or a linker group;
A is a polar group;
B is a A, hydrogen, substituted or unsubstituted $C_{1-16}$ alkoxy, substituted or unsubstituted $C_{5-14}$ aryl, substituted or unsubstituted arylalkyl, substituted or unsubstituted $C_{5-14}$ heteroaryl, substituted or unsubstituted heteroarylalkyl and substituted or unsubstituted $C_{1-16}$ alkyl wherein one or more non-adjacent C atoms may be replaced with —O—, —NR—, —NH—, —S—, —COO—, —NHCO—, —NHSO$_2$—, —NHCOO-groups wherein R is $C_{1-8}$ alkyl; and
each of a and b are independently an integer selected from 1 to 5.

When either of a or b is greater than 1, there are more than 1 A and B groups respectively attached to the linker, e.g. when a is 2, there are 2 A groups attached to the linker. When multiple A and/or B groups are present, they may be attached to the linker at different atoms.

Preferred light emitting polymers comprise a repeat unit of formula X shown below:

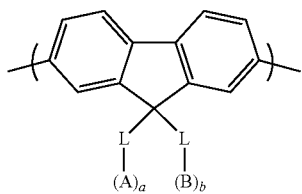
Xc

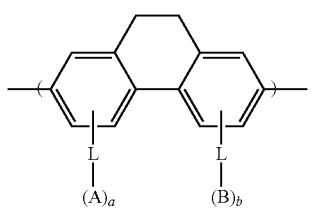
Xd

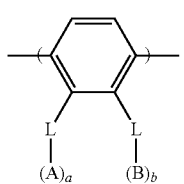
Xe

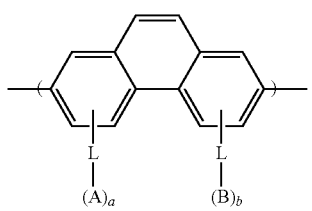
Xf

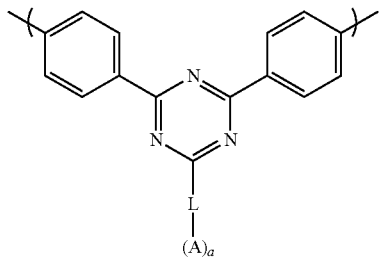
Xg

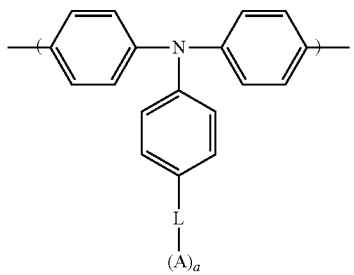
Xi

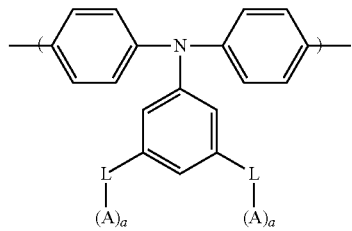
Xh wherein L, A, B, a and b are as defined above in relation to formula Xa and Xb.

Particularly preferably the light emitting polymer comprises repeat units of formula (Xc):

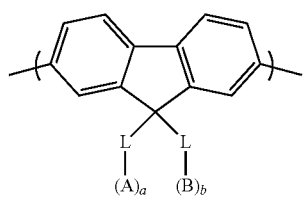
(Xc)

wherein L, A, B, a and b are as defined above in relation to formula Xa and Xb.

In preferred light emitting polymers, $(B)_b$ is $(A)_a$, i.e. the repeat unit comprises identical polar groups per unit. In further preferred light emitting polymers a is 1 or 2.

In further preferred light emitting polymers, L is a linker group selected from substituted or unsubstituted $C_{5-14}$ aryl, substituted or unsubstituted $C_{5-14}$ heteroaryl and substituted or unsubstituted $C_{1-16}$ alkyl wherein one or more non-adjacent C atoms may be replaced with —O—, —NR—, —NH—, —S—, —COO—, —NHCO—, —NHSO$_2$—, —NHCOO-groups wherein R is $C_{1-8}$ alkyl. More preferably L is a linker group selected from substituted or unsubstituted $C_{5-14}$ aryl and substituted or unsubstituted $C_{1-16}$ alkyl wherein one or more non-adjacent C atoms may be replaced with —O—, —NR—, —NH—, —S—, —COO—, —NHCO—, —NHSO$_2$—, —NHCOO-groups wherein R is $C_{1-8}$ alkyl. In some light emitting polymers, L is a $C_{5-14}$ aryl, especially a $C_5$ or $C_6$ aryl, e.g. phenyl. In other light emitting polymers, L is a $C_{1-16}$ alkyl, more preferably a $C_{1-6}$ alkyl and yet more preferably a $C_{1-4}$ alkyl.

Particularly preferably the light emitting polymer comprises a repeat unit of formula (Xci) or (Xcii):

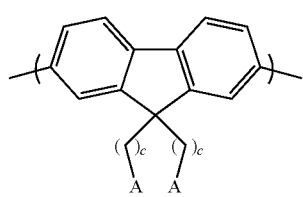
(Xci)

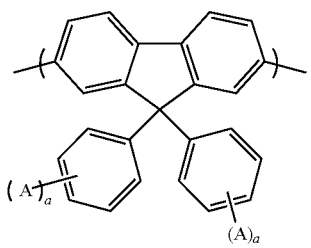

(Xcii)

wherein
n is an integer between 1 and 16.
A is a polar group; and
a is an integer from 1 to 5.

Preferably n is an integer between 1 to 6 and yet more preferably an integer between 1 and 4, e.g. 2. Preferably a is 1 or 2. In formula (Xcii) when one A group is present (i.e. a is 1) it is preferably present in the 4 position. In formula (Xcii) when two A groups are present (i.e. a is 2), they are preferably present at the 3 and 4 positions. More preferably the light emitting polymer comprises a repeat unit of formula (Xcii).

In preferred light emitting polymers of the invention, the polar group comprises at least one moiety selected from —NHCO—, —NHSO$_2$—, —COO—, —OCOO—, —NHCOO, —O—, —NR—, —NH—, —NO—, —S—, —CF$_2$— and —CCl$_2$— wherein R is $C_{1-8}$ alkyl. Preferably the polar group comprises at least one —O— moiety, and more preferably a plurality of —O-moeities.

Particularly preferred polar groups present in the light emitting polymer of the invention are those of formula:

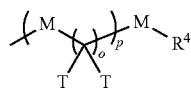

wherein
M is O, NR, NH, S or CQ wherein R is $C_{1-8}$ alkyl;
Q is Br, Cl, F, I or H;
T is Br, Cl, F, I or H;
o is an integer from 1 to 4;
p is an integer from 1 to 16; and
$R^4$ is H or $C_{1-8}$ alkyl.

In preferred groups, M is O, NR or NH, particularly O.
In further preferred groups, T is Cl, F or H, particularly H.
In further preferred groups, o is 2 or 3, particularly 2.
In further preferred groups, p is 1 to 12. In some groups p is more preferably 3 to 10, and still more preferably 4 to 8. In other groups p is more preferably 2 to 6 and still more preferably 2 or 3.
In further preferred groups, $R^4$ is H, —CH$_3$ or —CH$_2$CH$_3$.

Yet more preferred polar groups present in the light emitting polymer of the invention are those of formula:

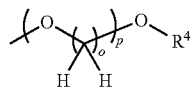

wherein
o is an integer from 1 to 4;
p is an integer from 1 to 16; and
$R^4$ is H or $C_{1-6}$ alkyl.

In preferred groups, o is 2 or 3, particularly 2.
In further preferred groups, p is 1 to 12. In some groups p is more preferably 3 to 10, and still more preferably 4 to 8. In other groups p is more preferably 2 to 6 and still more preferably 2 or 3.
In further preferred groups, $R^4$ is H, —CH$_3$ or —CH$_2$CH$_3$.

Especially preferably the polar group present in the light emitting polymer of the invention comprises at least one —(CH$_2$CH$_2$O)— unit.

Particularly preferred light emitting polymers present in the light emitting layer of the present invention comprises a repeat unit of formula (Xcf) or (Xcg):

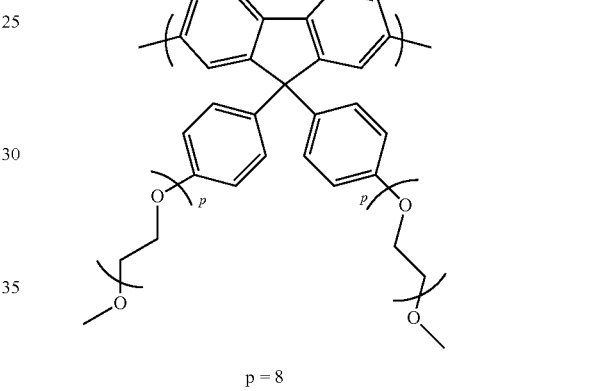

p = 8

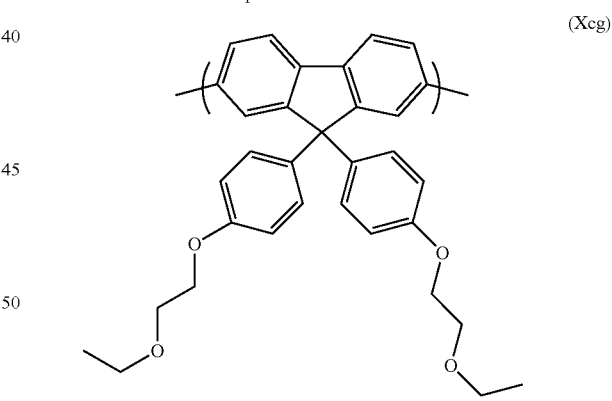

Repeat units of formula (X) may be incorporated into light emitting polymers using appropriate monomers and methods conventional in the art. The skilled man can determine suitable monomers.

The light emitting polymer present in the light emitting layer of the present invention optionally comprises further repeat units. Some preferred light emitting polymers comprise a repeat unit of formula (A) which is an substituted or unsubstituted, 2,7-linked fluorene and more preferably a repeat unit of formula (A) as shown below:

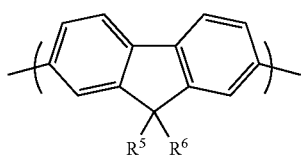

(A)

wherein $R^5$ and $R^6$ are independently selected from hydrogen, unsubstituted or substituted $C_{1-16}$ alkyl, wherein one or more non-adjacent C atoms may be replaced with O, S, N, CO and —COO—, unsubstituted or substituted $C_{1-16}$ alkoxy, unsubstituted or substituted $C_{5-14}$ aryl, unsubstituted or substituted arylalkyl, unsubstituted or substituted $C_{5-14}$ heteroaryl and unsubstituted or substituted heteroarylalkyl. Optional substituents are preferably selected from the group consisting of $C_{1-16}$ alkyl or $C_{1-16}$ cycloalkyl wherein one or more non-adjacent C atoms may be replaced with O, S, N, C=O and —COO—, unsubstituted or substituted $C_{5-14}$ aryl, unsubstituted or substituted $C_{5-14}$ heteroaryl, $C_{1-16}$ alkoxy, $C_{1-16}$ alkylthio, fluorine, cyano and arylalkyl.

In preferred repeat units of formula (A) $R^5$ and $R^6$ are the same. In particularly preferred repeat units at least one and more preferably both of $R^5$ and $R^6$ comprise an unsubstituted or substituted $C_{1-16}$ alkyl or an unsubstituted or substituted $C_{5-14}$ aryl, e.g. a $C_6$ aryl. Preferred substituents of aryl groups are $C_{1-16}$ alkyl and still more preferably an unsubstituted $C_{1-16}$ alkyl group.

Particularly preferred repeat units of formula (A) are shown below. The repeat unit (Ai) is particularly preferred.

Ai

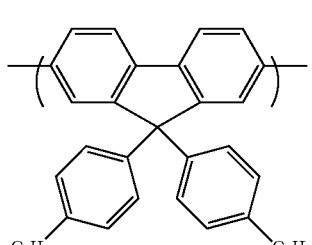

Aii

Aiii

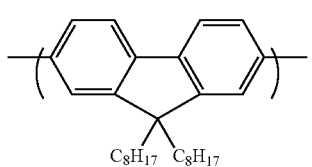

Aiv

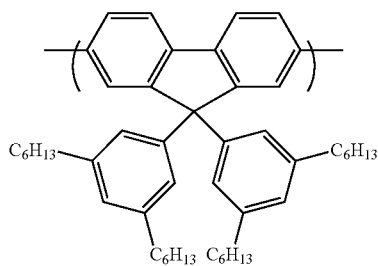

Av

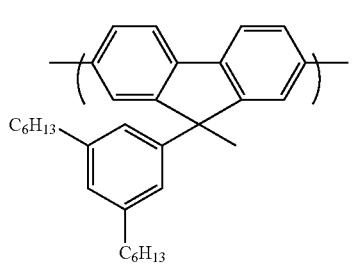

Repeat units of formula (A) may be incorporated into light emitting polymers using monomers as described in WO2002/092723.

Further preferred light emitting polymers present in the light emitting layer comprise repeat units of formula (B):

(B)

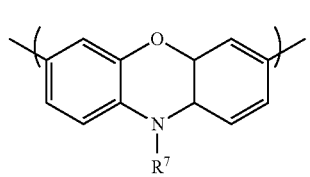

wherein $R^7$ is selected from unsubstituted or substituted $C_{1-16}$ alkyl, wherein one or more non-adjacent C atoms may be replaced with O, S, N, CO and —COO—, unsubstituted or substituted $C_{1-16}$ alkenyl, unsubstituted or substituted $C_{1-16}$ alkoxy, unsubstituted or substituted $C_{5-14}$ aryl, unsubstituted or substituted arylalkyl, unsubstituted or substituted $C_{5-14}$ heteroaryl and unsubstituted or substituted heteroarylalkyl. Optional substituents are preferably selected from the group consisting of $C_{1-16}$ alkyl or $C_{1-16}$ cycloalkyl wherein one or more non-adjacent C atoms may be replaced with O, S, N, C=O and —COO—, unsubstituted or substituted $C_{5-14}$ aryl, unsubstituted or substituted $C_{5-14}$ heteroaryl, $C_{1-16}$ alkoxy, $C_{1-16}$ alkylthio, fluorine, cyano and arylalkyl.

In preferred repeat units of formula (B) $R^7$ is an unsubstituted or substituted $C_{5-14}$ aryl, e.g. a $C_6$ aryl. Preferred substituents of aryl groups are $C_{1-16}$ alkyl and still more preferably an unsubstituted $C_{1-16}$ alkyl group such as an unsubstituted $C_{1-6}$ alkyl group.

A particularly preferred repeat unit of formula (B) is shown below as formula (Bi):

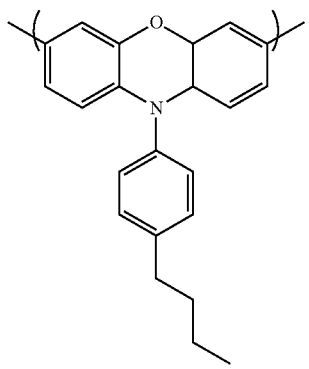
(Bi)

Repeat units of formula (Bi) may be incorporated into light emitting layers using monomers described WO2004/060970.

Preferably the light emitting polymer comprises at least one repeat unit comprising a cross-linkable group. Preferably the at least one repeat unit comprising a cross-linkable group is selected from formulae (Ca) or (Cb):

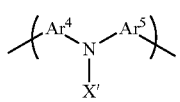
(Ca)

wherein $Ar^4$ and $Ar^5$ represent $C_{5-14}$ aryl or $C_{5-14}$ heteroaryl and X' is a cross-linkable group;

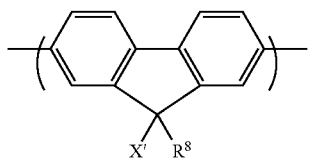
(Cb)

wherein X' is a cross-linkable group and $R^8$ is independently selected from X', hydrogen, unsubstituted or substituted $C_{1-16}$ alkyl, wherein one or more non-adjacent C atoms may be replaced with O, S, N, CO and —COO—, unsubstituted or substituted $C_{1-16}$ alkenyl, unsubstituted or substituted $C_{1-16}$ alkoxy, optionally substituted $C_{5-14}$ aryl, unsubstituted or substituted arylalkyl, unsubstituted or substituted $C_{5-14}$ heteroaryl and unsubstituted or substituted heteroarylalkyl.

In preferred units of formula (Ca) $Ar^4$ and $Ar^5$ are the same. In particularly preferred repeat units $Ar^4$ and $Ar^5$ comprise substituted or unsubstituted $C_{5-14}$ aryl. When present, preferred substituents for $Ar^4$ and $Ar^5$ include $C_{1-16}$ alkyl and $C_{1-16}$ alkoxy groups. Especially preferred $Ar^4$ and $Ar^5$ groups are unsubstituted $C_6$ aryl.

Examples of cross-linkable group X' in repeat unit (Ca) include moieties containing a double bond, a triple bond, a precursor capable of in situ formation of a double bond, or an unsaturated heterocyclic group. In some preferred repeat units of formula (Ca) the cross-linkable group X' contains a precursor capable of in situ formation of a double bond. More preferably X' contains a benzocyclobutanyl group. Especially preferred X' groups comprise a $C_{5-12}$ aryl group substituted with a benzocyclobutanyl group, particularly preferably $C_8$ aryl substituted with a benzocyclobutanyl group.

A particularly preferred repeat unit of formula (Ca) is shown below:

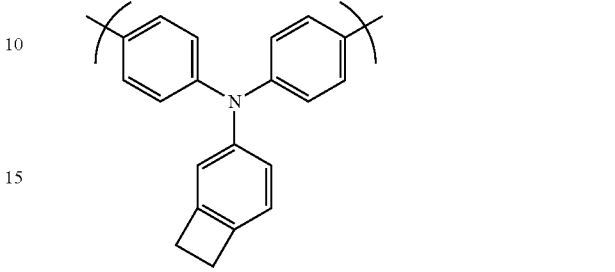
(Cc)

Repeat units of formula (Ca) may be incorporated into light emitting polymers using monomers as described in WO2005/052027.

In preferred repeat units of formula (Cb) X' is a double bond, a triple bond, a precursor capable of in situ formation of a double bond, or an unsaturated heterocyclic group. In some preferred repeat units of formula (Cb) the cross-linkable group X' is contains a double bond or is a precursor capable of in situ formation of a double bond. More preferably X' contains —CH=CH$_2$ group or a benzocyclobutanyl group. Especially preferred X' groups comprise a $C_{1-16}$ alkyl group, a $C_{1-16}$ alkylidene group or a $C_{5-12}$ aryl group substituted with a benzocyclobutanyl group, particularly preferably $C_{1-16}$ alkyl group substituted with a benzocyclobutanyl group.

In preferred repeat units of formula (Cb) $R^8$ is X'. Still more preferably X' and $R^8$ are identical.

Three particularly preferred repeat units of formula (Cb) are shown below. Repeat unit Ci is particularly preferred.

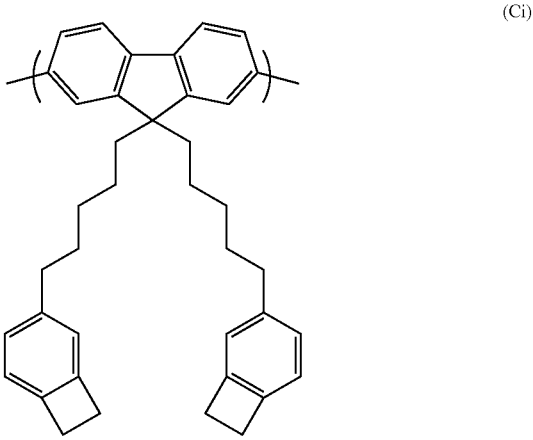
(Ci)

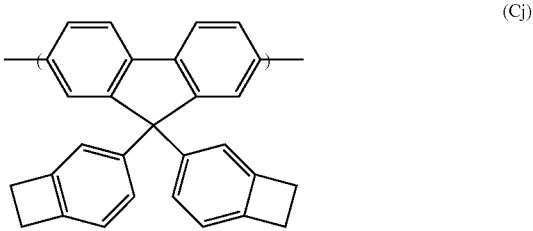
(Cj)

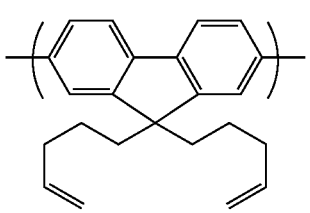

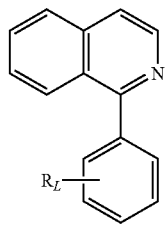

Repeat units of formula (Cb) may be incorporated into light emitting polymers using monomers as described in WO02002/092723.

Preferably the light emitting polymer comprises at least one repeat unit of formula (D):

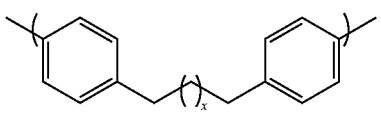

(D)

wherein x is selected from an integer between 1 and 6 and more preferably 2, 3, 4 or 5.

A particularly preferred repeat unit of formula (D) is shown below as formula (Di):

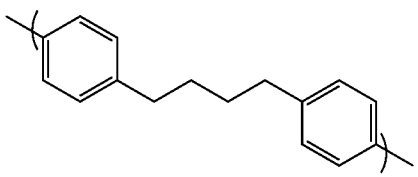

Repeat units of formula (D) may be incorporated into light emitting polymers using monomers as described in WO2013/093400.

Light emitting polymers present in the light emitting layer may optionally contain a light emitting unit. Preferred light emitting units are present as end caps in the polymer. Preferred light emitting units are of formula (E):

 (E)

wherein M is a metal; each of $L^1$, $L^2$ and $L^3$ is a ligand; q is an integer; r and s are each independently 0 or an integer; and the sum of $(a \cdot q)+(b \cdot r)+(c \cdot s)$ is equal to the number of coordination sites available on M, wherein a is the number of ligating sites on $L^1$, b is the number of ligating sites on $L^2$ and c is the number of ligating sites on $L^3$.

In preferred monomers of formula (E) $L^1$, $L^2$ and $L^3$ are bidentate ligands. In further preferred monomers of formula (E) $L^1$, $L^2$ and $L^3$ are biaryl bidentate ligands, especially preferably biaryl bidentate ligands comprising one or more (e.g. one) heteroatoms. Preferably the heteroatom or heteroatoms are oxygen or nitrogen. In particularly preferred monomers of formula (E) $L^1$, $L^2$ and $L^3$ are biaryl bidentate nitrogen-containing ligands. The preferred metal M is iridium.

Particularly preferred light emitting units of formula (E) are those in which at least one of $L^1$, $L^2$ and $L^3$ are of the following structure:

(Ck)

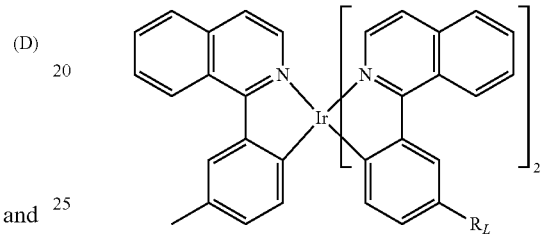

wherein $R_L$ is H or Ar wherein Ar is aryl, especially substituted $C_6$ aryl.

Preferred light emitting units of formula (E) are as follows:

wherein $R_L$ is as defined above.

A particularly preferred light emitting of formula (Ei) is shown below:

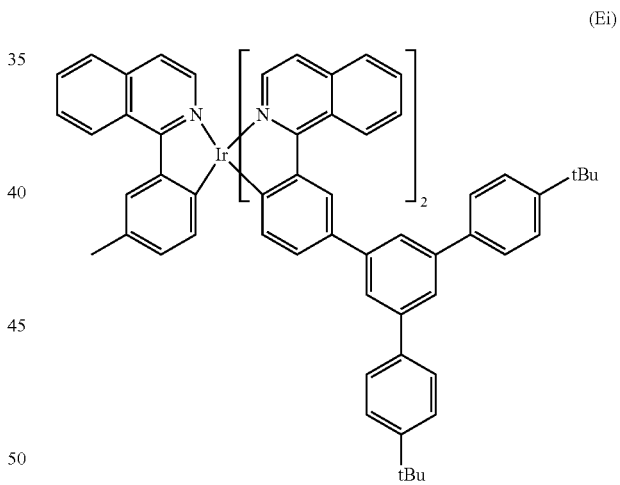

(Ei)

Repeat units of formula (E) may be incorporated into light emitting polymers using appropriate monomers and methods conventional in the art. The skilled man can determine suitable monomers.

In one preferred embodiment the light emitting polymer present in the light emitting layer comprises the repeat units (Xcg) and (Xcf). In another preferred embodiment the light emitting polymer present in the light emitting layer comprises the repeat units (Xg), (Bi), (Ei) and optionally (Xf).

The amount of each of the different repeat units present in the light emitting polymer may vary. Preferably, however, the total wt % of repeat units of formula (X) is 40 to 100%. Preferably the total wt % of repeat units of formula (B) is 10 to 40% wt. Preferably the total wt % of repeat units of formula (E) is 0.01 to 0.1%. Preferably the total wt % of repeat units of formula (A) is 0 to 35%. Preferably the total wt % of repeat units of formula (C) is 0 to 20%. Preferably the total wt % of repeat units of formula (D) is 0 to 20%.

Preferred light emitting layers of the present invention further comprise a salt or a mixture of salts. In some devices, e.g. LECs, multiple salts with different ionic sizes help to improve lifetime and efficiency, to achieve faster device turn on while maintaining the longer lifetimes and provide better compatibility with the other components of the light emitting layer.

Representative examples of suitable salts, divided into three groups according to their properties are set out below:

Group I salts for Ionic Mobility—Salts that have smaller anions or cations tend to be more mobile than salts with bulky anions or cations. Examples of salts with small anions include those with anions containing halides (fluorine, bromine, chlorine, and iodine), hexafluorophosphide ($PF_6^-$), tetrafluoroborate ($BF_4^-$), organoborates, thiocyanate, dicyanamide, alkylsulfates, tosylates, methanesulfonate, trifluoromethanesulfonate, bis(trifluromethyl-sulfonyl)imide, tetracyanoborate, trifluroacetate, tri(pentafluroethyl)trifluorophosphate, bis[oxalate(2-)] borate, sulfamate, bis[1,2-benzenediolate (2-)—O,O'] borate and perchlorate ($ClO_4^-$). Examples of salts with mobile cations include salts containing an alkali metal (such as lithium, sodium, potassium, rubidium, and cesium), a divalent metal (such as magnesium, calcium, strontium, and barium), nitrogen-based salts with small side chains (such as ammonium ($NH_4^+$), tetramethylammonium ($TMA^+$), tetraethylammonium ($TEA^+$), tetrabutyl ammonium ($TBA^+$), tetrapentylammonium ($TPA^+$), tetrahexylammonium ($THA^+$) tetraheptylammonium ($THPA^+$)), aromatic nitrogen-based cations (derived from imidazole, pyridine, pyrrole, pyrazole, etc.), morpholium, piperdinium, phosphonium (such as trihexyl (tetradecyl)phosphonium ($THP^+$), sulfonium, and guanidinium. A salt selected for ionic mobility may have both a mobile cation and anion or a mixture of salts could be used to obtain a mixture containing high mobility cations and anions. The inclusion of salts that can rapidly dissociate provides components that can move rapidly at initial ambient temperatures at turn on and at steady operating temperatures of devices (for example from −20 to 85° C.). Ionic salts that are liquid in these temperature ranges are sometimes generally termed "ionic liquids" which are more generally defined as salts whose melting point is relatively low (below 100° C.).

Group II salts for Ionic Stability—Salts that result in the greatest ionic mobility and lowest initial operating voltages may not be the most electrochemically stable. To improve device lifetime, the anion or cation may be chosen for greater electrochemical stability. Examples of salts with greater stability are trifluoromethanesulfonate ($CF_3SO_3^-$) also known as triflate ($TF^-$)), bis(trifluoromethylsulphonyl) imide ($TFSI^-$), and related anions containing triflate. The triflate anion is an extremely stable polyatomic ion, being the conjugate base of one of the strongest known acids, triflic acid. Examples of cations with greater electrochemical stability include cyclic cations such pyrolidinium and piperdinium, and aliphatic and nitrogen-containing cations, such as tetramethylammonium ($TMA^+$), tetraethylammonium ($TEA^+$), tetrabutylammonium ($TBA^+$), tetrapentylammonium ($TPA^+$), tetrahexylammonium ($THA^+$), and tetraheptylammonium. A salt selected for stability can contain a more electrochemically stable cation and anion or a mixture of salts can be used to obtain new combinations of more stable cations and anions.

Group III salts for Polymer Compatibility—The aliphatic nature of many salts (for example, those including tetrahexylammonium hexafluorophosphate ions) can lead to issues with phase separation when added to a light emitting polymer containing an aromatic backbone. Improved compatibility can be achieved by adding salts containing aromatic anions or cations. Examples of aromatic cations are tribenzyl-n-octylammonium ($BzOA^+$) and benzyltri(n-hexyl) ammonium. Examples of aromatic anions are tetraphenylborate ($BPh_4^-$ and bis[1,2-benzeneddiobate (2-)—O, O'] borate. A salt selected for compatibility can contain an aromatic cation and anion or a mixture of salts could be used to obtain an aromatic cation and an aromatic anion.

In preferred light emitting layers of the invention a mixture of salts is present. Preferably the mixture optimises device performance. Preferably the mixture of salts comprises salts of Group I chosen for ionic mobility at low temperatures, salts of Group II chosen for greater electrochemical stability, and/or salts of Group III chosen for compatibility with aromatic polymers. Preferably the mixture comprises one or more salts from any two of the groups discussed above, and preferably salts from all three groups. Particularly preferably the mixture comprises $THAPF_6$ and $THPBF_4$.

Suitable salts are commercially available, for example, from Sigma Aldrich and Strem Chemicals Inc. The light emitting layer may comprise a salt, or mixture of salts, in an amount of 0 to 10% wt and more preferably 1 to 8% wt based on the dry solid weight of the light emitting layer.

Preferred light emitting layers of the present invention further comprise a compatabiliser. Preferably the compatabiliser is a copolymer. Still more preferably the compatabiliser is a copolymer of a siloxane, more preferably a $C_{1-6}$ alkyl siloxane and still more preferably a di $C_{1-6}$ alkylsiloxane. Still more preferably the compatabiliser is a copolymer of ethylene oxide and/or propylene oxide and more preferably ethylene oxide. Examples of suitable compatibilisers are DBE-821 and Triblock DBP-534. A particularly preferred compatabiliser is a dimethylsiloxane-ethylene oxide block copolymer available from Gelest, Inc under the tradename DBE-821.

The light emitting layer may comprise a compatabiliser in an amount of 0 to 15% wt and more preferably 1 to 8% wt based on the dry solid weight of the light emitting layer.

In the method of the present invention the electrode deposited on the light emitting layer preferably has a thickness of 500 nm to 20 μm. Preferably the light emitting layer has a thickness of 20-2000 nm. Preferably the electrode is in the form of a pattern.

The electrode of the present invention is preferably incorporated into a layered structure wherein the electrode is deposited on a light emitting layer. Thus the invention also concerns a method of making a layered structure for an organic electronic device comprising:
  (i) depositing a light emitting layer on a surface;
  (ii) drying said light emitting layer;
  (iii) depositing an ink on said light emitting layer; and
  (iv) drying said ink to form said electrode;
wherein said ink is as hereinbefore defined.

Preferably the layered structure has a thickness of 500 nm to 20 μm. Depositing the ink is preferably by printing. Drying is preferably by box oven, IR oven or hot plate.

The electrode or the layered structure of the present invention is preferably used in the manufacture of organic electronic devices. Examples of organic electronic devices that may be prepared using the electrode and the layered structure of the present invention include organic light emitting diodes (OLEDs), light emitting electrochemical cells (LECs), organic photovoltaic devices (OPVs), organic photosensors, organic transistors and organic memory array devices. Preferred devices are OLEDs and LECs. OLEDs and LECs comprise an anode, a light emitting layer and a cathode.

The electrode of the present invention is preferably present as an anode or cathode and more preferably as a cathode. Thus the present invention also relates to a method of making an organic electronic device comprising:
 (i) providing an anode on a substrate;
 (ii) depositing a light emitting layer on said anode;
 (iii) drying said light emitting layer;
 (iv) depositing an ink on said light emitting layer; and
 (v) drying said ink to form said electrode,
wherein said ink is as hereinbefore defined.

The device (e.g. OLED) may also include a hole injection layer and/or one or more interlayers. In this case the light emitting layer may be deposited on the hole injection layer. Preferably, however, the device does not comprise any of such layers.

Devices may be prepared by conventional techniques. Preferably the anode is deposited on the substrate by printing (e.g. screen printing) or by thermal evaporation. Preferably the light emitting layer is deposited by a solution-based processing method. Any conventional solution-based processing method may be used. Representative examples of solution-based processing methods include spin coating, dip coating, dispense printing, gravure printing, nozzle printing, slot die coating, doctor blade coating, ink-jet printing and screen printing. In preferred methods, however, depositing is by screen printing or spin coating. The parameters used for spin coating the light emitting layer such as spin coating speed, acceleration and time are selected on the basis of the target thickness for the layer. Preferably the ink is deposited by printing and in particular screen printing.

In preferred methods of the invention, during printing of the cathode on the light emitting layer, the Δ Roughness (ΔRa) of the surface is changed by less than 50 nm and more preferably by less than 25 nm, e.g. 0 to 20 nm, wherein Ra is the arithmetic average roughness of the measurements of the surface roughness, e.g. as measured using white light interferometry over a 600-900 µm span of substrate. In further preferred methods of the invention, during printing of the cathode on the light emitting layer, the Δ thickness of the light emitting polymer layer is changed by less than 15 nm and more preferably by less than 10 nm, e.g. 0 to 10 nm. Still more preferably the thickness of the light emitting polymer layer is changed by less than 10% and more preferably less than 5% of the total thickness of the layer.

The substrate may be any material conventionally used in the art such as glass or plastic. Optionally the substrate is pre-treated to improve adhesion thereto. Preferably the substrate is transparent. Preferably the substrate also has good barrier properties to prevent ingress of moisture or oxygen into the device. Typically the substrate has a thickness of 50-1000 µm.

The anode preferably comprises indium tin oxide (ITO) or indium zinc oxide (IZO). Preferably the ITO or IZO present in the anode is deposited by printing, e.g. screen printing or by thermal evaporation. The anode is preferably 20 to 200 nm thick and more preferably 10 to 100 nm thick.

Preferably the light emitting layer is deposited by spin coating, dip coating, dispense printing, gravure printing, nozzle printing, slot die coating, doctor blade coating, ink-jet printing and screen printing. The light emitting layer is preferably 50 to 1000 nm thick.

The cathode is formed on the light emitting layer as hereinbefore disclosed. Preferably the cathode is deposited by printing, e.g. screen printing. The cathode is preferably 100 nm to 10 µm thick.

Preferred devices of the invention are also encapsulated to avoid ingress of moisture and oxygen. Conventional encapsulation techniques may be used. Suitable encapsulants include a sheet of glass, films having suitable barrier properties such as silicon dioxide, silicon monoxide, silicon nitride or alternating stacks of polymer and dielectric as disclosed in, for example, WO 01/81649 or an airtight container as disclosed in, for example, WO 01/19142. A material for absorption of any atmospheric moisture and/or oxygen that may permeate through the substrate or encapsulant may optionally be disposed between the substrate and the encapsulant.

Preferred devices of the present invention have one or more of the following structural characteristics:

| Substrate: | Glass surface |
|---|---|
| Anode: | ITO |
| Anode thickness: | 20 to 200 nm |
| Light emitting layer: | LEP1-4 as described in the examples |
| Light emitting layer thickness: | 50 to 1000 nm |
| Cathode: | Ag or C in binder |
| Cathode thickness: | 100 nm to 10 µm |

The present invention also relates to the use of an ink to print an electrode on a light emitting layer of an organic electronic device, wherein said ink comprises conductive particles, a binder and a hydrocarbon solvent. Preferably the ink is as hereinbefore defined. Preferably the light emitting layer is as hereinbefore defined. Preferably the device is an OLED or LEC.

The present invention also relates to an ink for printing an electrode for an organic electronic device comprising: carbon particles, a binder and a hydrocarbon solvent. Preferably the hydrocarbon solvent is as hereinbefore defined. Preferably the binder is as hereinbefore defined. Preferably the device is an OLED or LEC.

BRIEF DESCRIPTION OF THE DRAWINGS

These and other aspects of the invention will now be further described, by way of example only, with reference to the accompanying figures in which.

DETAILED DESCRIPTION OF THE INVENTION

Figure 1:
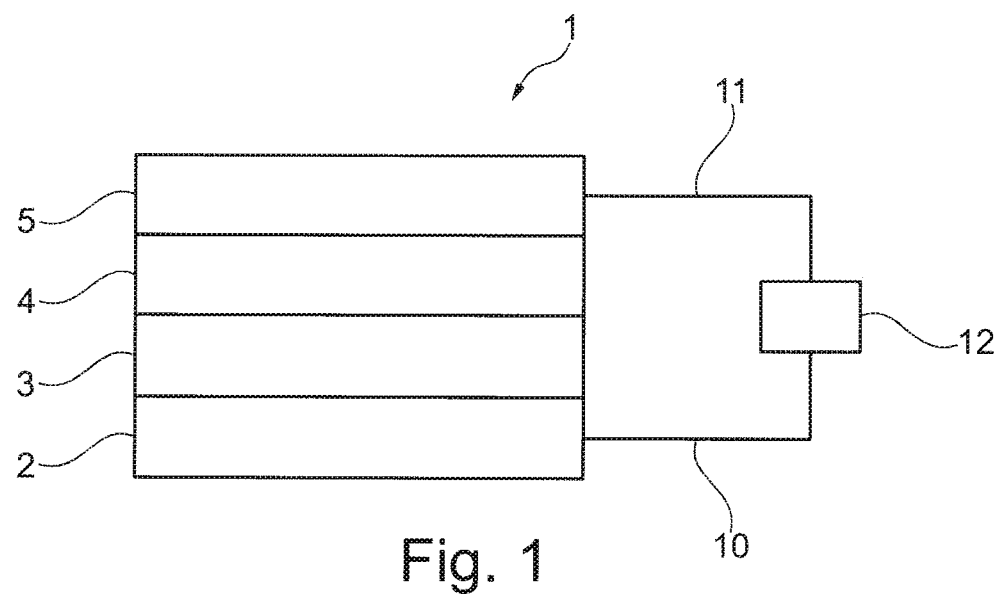
FIG. 1 is a schematic of a preferred OLED prepared according to the process of the invention.

A cross-section through a basic structure of a typical LEC 1 is shown in FIG. 1. A glass or plastic substrate 2 supports an anode 3 comprising, for example, ITO. A light emitting layer 4 is present on the anode layer. Finally a cathode 5 comprises silver or carbon particles present in a matrix of binder deposited from an ink according to a method of the present invention. Contact wires 10 and 11 to the anode and the cathode respectively provide a connection to a power source 12.

Materials

The light emitting layer of the LEC comprised a light emitting polymer, poly(ethylene oxide) (PEO), two salts and a compatibiliser.

The following hydrocarbon solvents were employed as part of the present invention: 1,1'-bicyclohexyl, undecane, and decalin (mixture of cis- or trans-decalin used). The following conventional solvents were employed to provide comparative examples: terpineol, carbitol acetate, γ-butyrolactone and ethylene glycol. All solvents were obtained from Sigma Aldrich.

Four different light emitting polymers were employed as follows:

LEP1 comprises repeat units (Xcf), (Di), (Ci), (Bi) and (Ei) described above. The ratio of the repeat units is 49.975% wt (Xcf), 5% wt (Di), 15% wt (Ci), 30% wt (Bi) and 0.05% wt (Ei).

LEP2 comprises repeat units (Xcf), (Ai), (Di), (Bi) and (Ei) described above. The ratio of the repeat units is 39.95% wt (Xcf), 25% wt (Ai), 5% wt (Di), 30% wt (Bi) and 0.05% wt (Ei).

LEP3 comprises repeat units (Xcf), (Xcg), (Bi) and (Ei) described above. The ratio of the repeat units is 50% wt (Xcf), 19.95% wt (Xcg), 30% wt (Bi), 0.05% wt (Ei).

LEP4 comprises repeat units (Xcf) and (Xcg) described above. The ratio of the repeat units is 50% wt (Xcf) and 50% wt (Xcg).

All light emitting polymers were polymerized by Suzuki polymerization as described in WO0053656.

PEO having a volume average molecular weight of 100K was obtained from Sigma Aldrich The compatibiliser was a dialkylsiloxane-ethylene oxide block copolymer, specifically dimethylsiloxane-ethylene oxide block copolymer (DBE-821). DBE-821 was obtained from Gelest, Inc.

The salt was trihexyl(tetradecyl)phosphonium hexafluorophosphate (THPPF$_6$)

Preparative Example for the Fabrication of a Printed Surface for Testing

A clean ITO coated slide was used and the Asymtek DispenseMate 585 dispense printer was used to deposit a 2 cm by 3 cm area of solution (2% wt in 4-methylanisole) comprising light emitting polymer or PEO which replicates the polymer components of the light emitting layer. This was then dried on a hot plate for 2 mins at 120° C. in an extracted environment.

Test Methods

A rinse test was employed to test the effect of various solvents on the light emitting layer, i.e. on the light emitting polymer and PEO components. Prior to solvent exposure, three scores were made on the surface of a sample of either a light emitting polymer or PEO using a sharp tool. White light from a Zygo interferometer was then used to measure the depth of the scores and the degree of roughness of the surface. In the rinse test, a 0.3 mL volume puddle of each solvent was then applied to the scored surface comprising either a light emitting polymer or PEO, and the excess was tipped off after a dwell time of 1 minute. The plate was then dried at 115° C. on a hotplate. The solvent impact was subsequently assessed by measuring changes in the layer thickness and Ra roughness on a Zygo interferometer. For Ra, for each plate, the roughness value is based on measurements taken on each of the three scratches. The change in roughness is worked out for each scratch and averaged for the plate. For thickness changes, the worst case change, which was often very similar to the average, was recorded.

A visual test was employed to test the effect of various solvents on the salts and compatibiliser components of the light emitting layer. In the visual test, a volume of each solvent was directly added to a sample of either the DBE-821 compatibiliser or salt. The resultant mixture was then sequentially stirred and heated and the degree of solubility of the compatibiliser or the salts was assessed visually.

Physical Properties of the Solvents Tested

The key physical properties of the solvents that were tested are summarised in table 1 below.

TABLE 1

| Solvent | Boiling point ° C. | Vapour pressure hPa @ 25° C. | Dielectric constant | Viscosity cP | Surface tension mN/m |
| --- | --- | --- | --- | --- | --- |
| 1,1'-Bicyclohexyl | 227 | 0.08 | 2.0 | 4 | 32.7 |
| Undecane | 191 | 0.06 | 2.0 | 1 | 24.7 |
| Decalin | 189-191 | 3 | 2.1 | | 31.5 |
| Terpineol | 213 | 10.5 | 2.8 | 37 | 33.2 |
| Carbitol acetate | 218 | 0.05 | | 3 | 31.7 |
| γ-Butyrolactone | 204 | 1.5 | 39.0 | 2 | 43.4 |
| Ethylene glycol | 196 | 0.08 | 37.0 | 17 | 47.7 |

Example 1: Impact of Rinse Test Using Hydrocarbon Solvents

Figure 2:
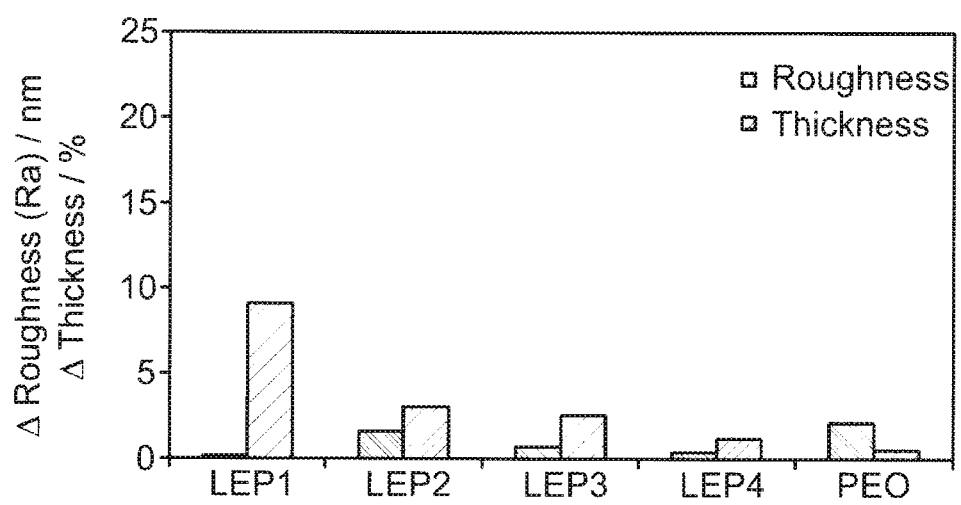
FIG. 2 is a bar graph showing the change in surface roughness and change in thickness of scores made on different light emitting polymer layer surfaces as a result of rinsing with 1,1'-bicyclohexyl as the solvent.
Figure 3:
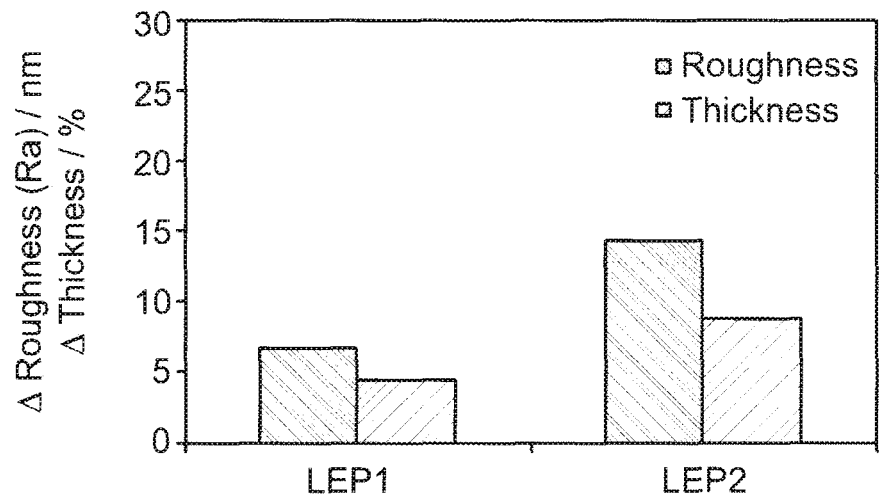
FIG. 3 is a bar graph showing the change in surface roughness and change in thickness of scores made on different light emitting polymer layer surfaces as a result of rinsing with decalin as the solvent.
Figure 4:
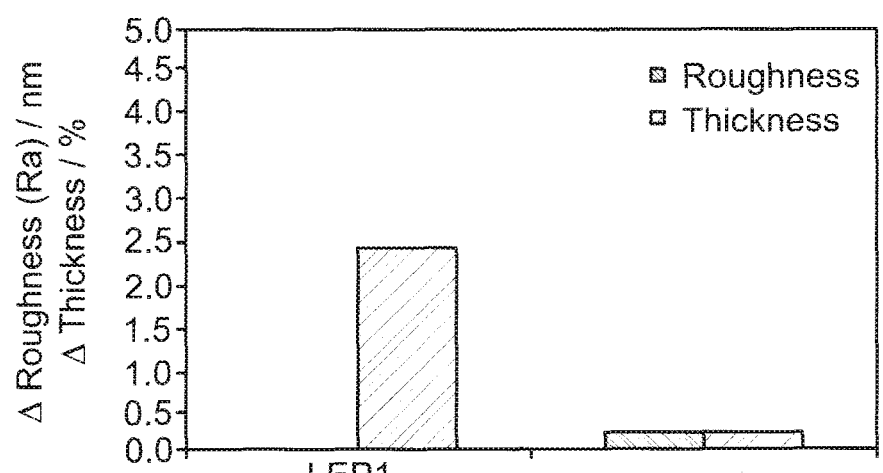
FIG. 4 is a bar graph showing the change in surface roughness and change in thickness of scores made on different light emitting polymer layer surfaces as a result of rinsing with undecane as the solvent.
Figure 5:
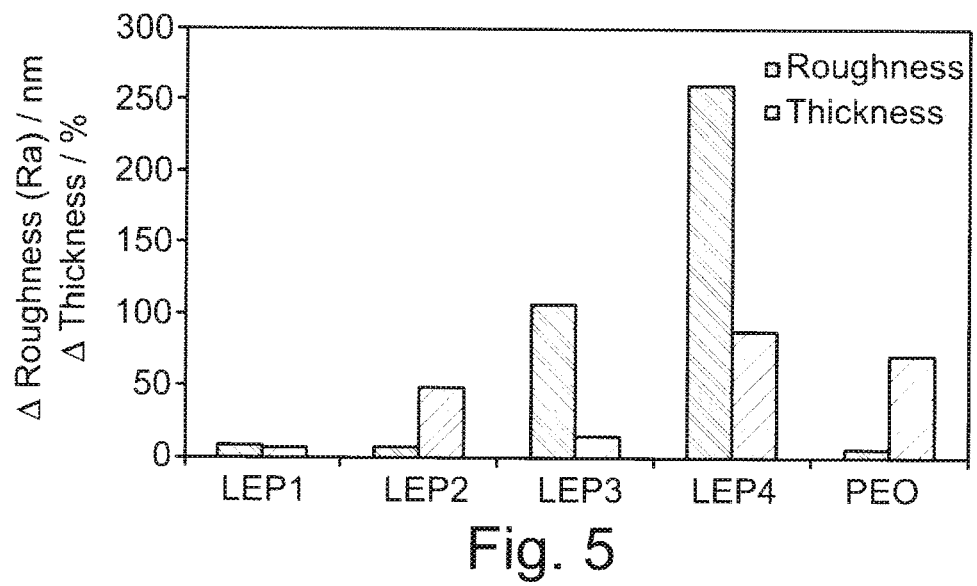
FIG. 5 is a bar graph showing the change in surface roughness and change in thickness of scores made on different light emitting polymer layer surfaces as a result of rinsing with the conventional solvent terpineol, which is not a hydrocarbon solvent.
Figure 6:
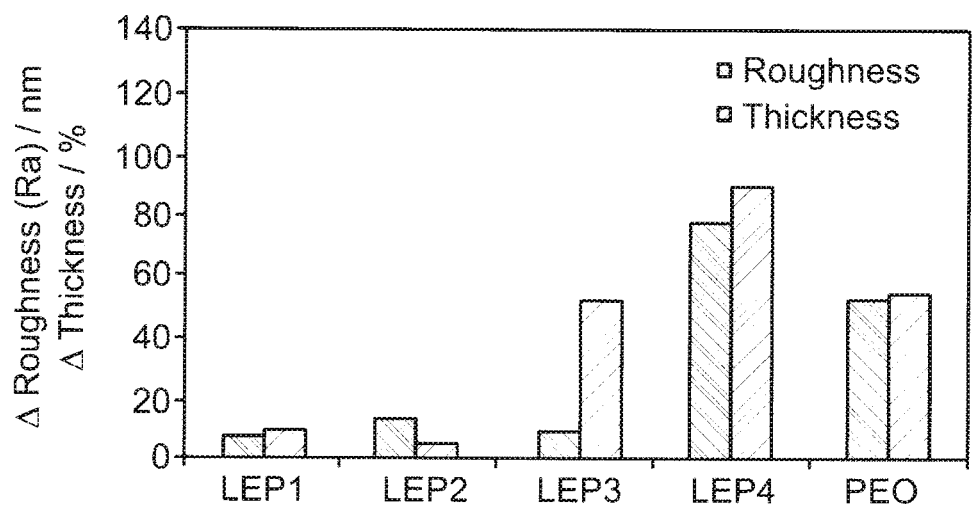
FIG. 6 is a bar graph showing the change in surface roughness and change in thickness of scores made on different light emitting polymer layer surfaces as a result of rinsing with the conventional solvet carbitol acetate, which is not a hydrocarbon solvent.
Figure 7:
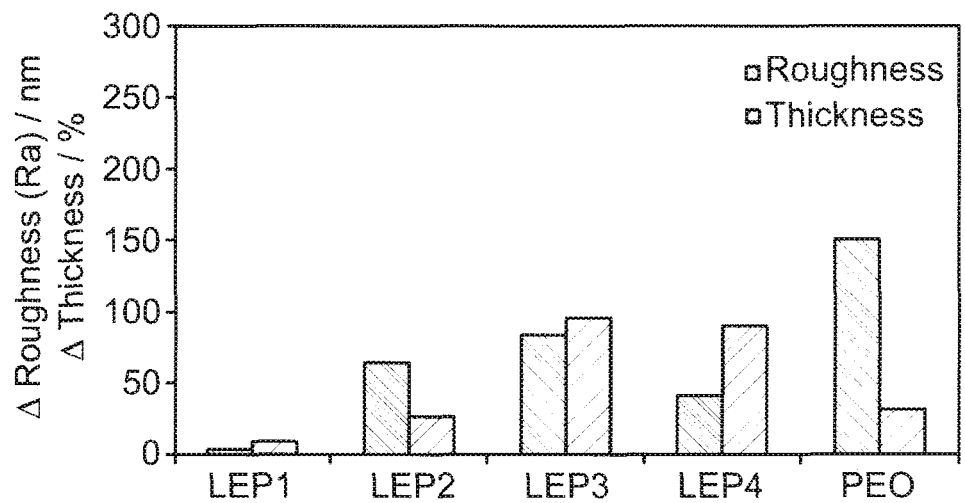
FIG. 7 is a bar graph showing the change in surface roughness and change in thickness of scores made on different light emitting polymer layer surfaces as a result of rinsing with the conventional solvent γ-butyrolactone, which is not a hydrocarbon solvent.
Figure 8:
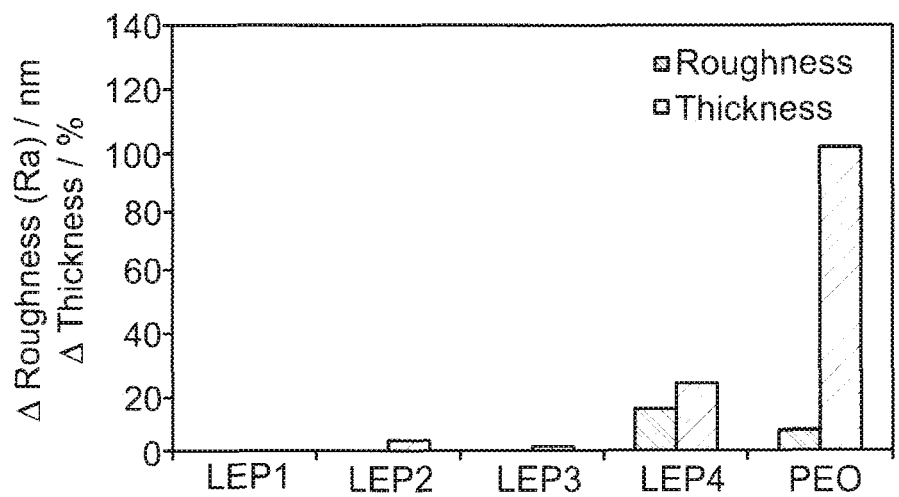
FIG. 8 is a bar graph showing the change in surface roughness and change in thickness of scores made on different light emitting polymer layer surfaces as a result of rinsing with the conventional solvent ethylene glycol, which is not a hydrocarbon solvent.

A surface of a light emitting polymer was prepared as described above. The surface was scored and treated with hydrocarbon solvents according to the rinse test method detailed above. The change in roughness and change in thickness of the scores on the tested surface are summarised in table 2 below. The results are also shown in FIGS. 2-4.

TABLE 2

|  | LEP1 | LEP2 | LEP3 | LEP4 | 100k PEO |
|---|---|---|---|---|---|
| Roughness Change on Rinse and Dry/nm | | | | | |
| 1,1'-Bicyclohexyl | 0.2 | 1.6 | 0.7 | 0.4 | 2.1 |
| Decalin | 6.7 | 14.3 | | | |
| Undecane | 0 | 0.2 | | | |
| Thickness Remaining on Rinse and Dry/% | | | | | |
| 1,1'-Bicyclohexyl | 90.9 | 97.0 | 97.5 | 98.8 | 99.5 |
| Decalin | | | | | |
| Undecane | | | | | |
| Thickness Lost on Rinse and Dry/% | | | | | |
| 1,1'-Bicyclohexyl | 9.1 | 3.0 | 2.5 | 1.2 | 0.5 |
| Decalin | 4.5 | 8.8 | | | |
| Undecane | 2.4 | 0.2 | | | |

The results show that the hydrocarbon solvents tested caused little or no roughening or modification to any of the LEP or PEO polymer surfaces when compared to the conventional solvents. The results demonstrate that these solvents would be useful in screen printable inks for LEC and OLED devices as they are unlikely to be detrimental to the device performance by dissolving polymer components that form the light emitting layer and/or leading to shorted devices.

Comparative Example 1: Impact of Rinse Test Using Conventional Ink Solvents

A surface of a light emitting polymer was prepared as described above. The surface was scored and treated with conventional solvents according to the rinse test method detailed above. The change in roughness and change in thickness of the scores on the surface are summarised in table 3 below. The results are also shown in FIGS. 5-8.

TABLE 3

|  | LEP1 | LEP2 | LEP3 | LEP4 | 100k PEO |
|---|---|---|---|---|---|
| Roughness Change on Rinse and Dry/nm | | | | | |
| Terpineol | 8.8 | 7.4 | 106.6 | 260.1 | 6.1 |
| Carbitol acetate | 7.2 | 12.9 | 8.8 | 77.2 | 52.2 |
| γ-Butyrolactone | 3.6 | 64.7 | 84.3 | 41.5 | 150.5 |
| Ethylene glycol | 0.1 | 0.2 | 0.2 | 13.9 | 7.0 |
| Thickness Remaining on Rinse and Dry/% | | | | | |
| Terpineol | 87.4 | 51.2 | 85.0 | 11.9 | 28.5 |
| Carbitol acetate | 83.9 | 95.0 | 48.2 | 10.8 | 45.9 |
| γ-Butyrolactone | 80.3 | 73.4 | 3.8 | 9.5 | 68.0 |
| Ethylene glycol | 100.2 | 96.4 | 98.4 | 77.5 | 0.0 |
| Thickness Lost on Rinse and Dry/% | | | | | |
| Terpineol | 7.0 | 48.8 | 15.0 | 88.1 | 71.5 |
| Carbitol acetate | 9.0 | 5.0 | 51.8 | 89.2 | 54.1 |
| γ-Butyrolactone | 9.1 | 26.6 | 96.2 | 90.5 | 32.0 |
| Ethylene glycol | −0.2 | 3.6 | 1.6 | 22.5 | 100.0 |

The results show that these solvents caused significant roughening and modification to the surfaces of the light emitting polymers tested. In particular, ethylene glycol was found to roughen the more polar of the light emitting polymers tested and also PEO. The three conventional ink solvents (terpineol, carbitol acetate and γ-butyrolactone) were found to roughen all of the non-cross linked materials. The results suggest that these solvents are not good candidates for screen printable silver inks as they will be detrimental to the light emitting polymer and PEO components of the light emitting layer of an OLED or LEC device.

Table 4 below compares the visual appearance of the surfaces exposed to hydrocarbon solvent use in the inks of the present invention and comparative conventional solvents, wherein "VG" indicates that only a slight drying mark was observed, "OK" indicates that some local roughening where the solvent was retained was observed and "P" indicates significant surface roughening was observed.

TABLE 4

|  | LEP1 | LEP2 | LEP3 | LEP4 | 100K PEO |
|---|---|---|---|---|---|
| Bicycohexyl | VG | VG | VG | VG | VG |
| Terpineol | VG | OK | P | P | P |
| Carbitol acetate | VG | VG | OK | P | P |
| γ-Butyrolactone | VG | OK | P | P | P |
| Ethylene glycol | VG | VG | VG | OK | P |

Example 2: Impact of Visual Test Using Hydrocarbon Solvents

Compatibiliser DBE-821 and THPPF$_6$ were separately treated with hydrocarbon solvents and with conventional solvents according to the visual test method detailed above. Any change in solubility was assessed visually as shown in table 5 below.

TABLE 5

| Solvent | Salt solubilty cold + stirring | Salt solubility at 80° C. + stirring | DBE-821 miscibility |
|---|---|---|---|
| Bicycohexyl | Turbid suspension but not dissolved | Turbid suspension but not dissolved | Forms micelles Does not dissolve |
| Undecane | Does not dissolve | Does not dissolve | Does not dissolve |
| Terpineol | Dissolves | Dissolves | Two phases |
| Carbitol acetate | Dissolves | Dissolves | Dissolves |
| γ-Butyrolactone | Dissolves | Dissolves | Dissolves |
| Ethylene glycol | Does not dissolve | Turbid suspension but not dissolved | Forms micelles Does not dissolve |

The results show that hydrocarbon solvents do not dissolve the salts or the DBE-821 compatibiliser upon mixing, stirring and heating. The results show that, whilst ethylene glycol did not dissolve the salts, the effect of the remaining solvents was to bring about some dissolution of the DBE-821 and salt components.

The invention claimed is:

1. A method of making an electrode for an organic electronic device, the method comprising:
   (i) depositing an ink on a light emitting layer; and
   (ii) drying said ink to form said electrode;
   wherein said ink comprises conductive metal or carbon particles, a binder and a hydrocarbon solvent,
   wherein the binder is dissolved within the hydrocarbon solvent, and wherein said hydrocarbon solvent is of formula (II):

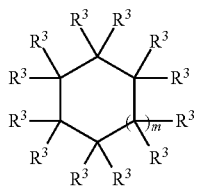
(II)

wherein
each $R^3$ is independently selected from H, $C_{1-6}$ alkyl and $C_{5-10}$ cycloalkyl, or
two $R^3$ groups on adjacent carbon atoms, together with the carbon atoms to which they are attached, form a ring or
two $R^3$ groups on the same carbon atom, together with the carbon atom to which they are attached, form a ring;
m is 0 or an integer between 1 and 6; and
at least one $R^3$ group is $C_{1-6}$ alkyl or $C_{5-10}$ cycloalkyl.

2. A method as claimed in claim 1, wherein said depositing of ink is by printing.

3. A method as claimed in claim 2, wherein said printing is screen printing.

4. A method as claimed in claim 1, wherein said hydrocarbon solvent is a $C_{8-18}$ hydrocarbon, or said hydrocarbon solvent has a boiling point of 170 to 350° C., or said hydrocarbon solvent has a vapour pressure of less than 200 Pa at 25° C.

5. A method as claimed in claim 1, wherein said hydrocarbon solvent is saturated.

6. A method as claimed in claim 1, wherein in said hydrocarbon solvent of formula (II) m is 1.

7. A method as claimed in claim 1, wherein said conductive particles comprise a metal.

8. A method as claimed in claim 1, wherein said binder comprises an alkyl cellulose, a polyacrylic, a polyacrylate or mixtures thereof.

9. A method as claimed in claim 1, wherein said light emitting layer comprises a light emitting polymer, or comprises poly(ethylene oxide), or further comprises a salt, or further comprises a compatabiliser.

10. A method as claimed in claim 9, wherein said light emitting polymer comprises a polar group.

11. A method as claimed in claim 1, wherein said organic electronic device is an OLED or a LEC.

12. A method of making an electrode for an organic electronic device, the method comprising:
(i) depositing an ink on a light emitting layer; and
(ii) drying said ink to form said electrode;
wherein said ink comprises conductive metal or carbon particles, a binder and a hydrocarbon solvent,
wherein the binder is dissolved within the hydrocarbon solvent, and
wherein said hydrocarbon solvent is of formula (II):

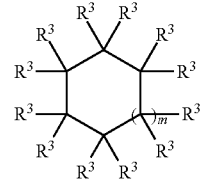
(II)

wherein
two $R^3$ groups on adjacent carbon atoms, together with the carbon atoms to which they are attached, form a ring or
two $R^3$ groups on the same carbon atom, together with the carbon atom to which they are attached, form a ring; and
m is 0 or an integer between 1 and 6.

13. A method as claimed in claim 12, wherein said depositing of ink is by printing.

14. A method as claimed in claim 12, wherein said conductive particles comprise a metal.

15. A method as claimed in claim 12, wherein said binder comprises an alkyl cellulose, a polyacrylic, a polyacrylate or mixtures thereof.

16. A method of making an electrode for an organic electronic device, the method comprising:
(i) depositing an ink on a light emitting layer; and
(ii) drying said ink to form said electrode;
wherein said ink comprises conductive metal or carbon particles, a binder and a hydrocarbon solvent,
wherein the binder is dissolved within the hydrocarbon solvent, and
wherein said hydrocarbon solvent is selected from 1,1'-bicyclohexyl, cis-decalin, trans-decalin or n-undecane.

17. A method as claimed in claim 16, wherein said depositing of ink is by printing.

18. A method as claimed in claim 16, wherein said conductive particles comprise a metal.

19. A method as claimed in claim 16, wherein said binder comprises an alkyl cellulose, a polyacrylic, a polyacrylate or mixtures thereof.

* * * * *